United States Patent
Kochan

[11] Patent Number: 6,104,197
[45] Date of Patent: Aug. 15, 2000

[54] APPARATUS FOR ACQUIRING WAVEFORM DATA FROM A METALLIC TRANSMISSION CABLE

[75] Inventor: Phillip F. Kochan, Redmond, Oreg.

[73] Assignee: Tektronix, Inc., Beaverton, Oreg.

[21] Appl. No.: 09/054,577

[22] Filed: Apr. 2, 1998

Related U.S. Application Data

[60] Provisional application No. 60/048,247, Jun. 2, 1997.

[51] Int. Cl.[7] .......................... G01R 31/11; G01S 13/00
[52] U.S. Cl. .................. 324/533; 324/534; 324/616; 342/195; 342/205
[58] Field of Search .................... 324/533, 534, 324/543, 642, 616, 607, 605; 342/205, 195, 89, 91, 92, 165, 174, 88, 83

[56] References Cited

U.S. PATENT DOCUMENTS

| | | | |
|---|---|---|---|
| 2,456,952 | 12/1948 | Kluender | 342/205 |
| 3,765,020 | 10/1973 | Seager et al. | 342/195 |
| 4,970,466 | 11/1990 | Bolles et al. | 324/533 |
| 5,128,619 | 7/1992 | Bjork et al. | 324/533 |
| 5,144,525 | 9/1992 | Saxe et al. | 365/45 |
| 5,155,439 | 10/1992 | Holmbo et al. | 324/534 |
| 5,365,328 | 11/1994 | Anderson | 356/73.1 |
| 5,373,356 | 12/1994 | Anderson | 356/73.1 |
| 5,440,528 | 8/1995 | Walsh | 368/113 |
| 5,461,318 | 10/1995 | Borchert et al. | 324/533 |
| 5,514,965 | 5/1996 | Westwood | 324/533 |
| 5,528,356 | 6/1996 | Harcourt et al. | 356/73.1 |
| 5,530,367 | 6/1996 | Bottman | 324/616 |
| 5,751,149 | 5/1998 | Oberg et al. | 324/533 |

*Primary Examiner*—Glenn W. Brown
*Assistant Examiner*—Anjan K Deb
*Attorney, Agent, or Firm*—William K. Bucher

[57] ABSTRACT

An apparatus for acquiring waveform data from a metallic transmission cable under test includes a transmitter for generating interrogating pulses for examining a segment or segment lengths of the transmission cable under test. A variable gain receiver receives a return signal from the segment or segment lengths of the cable and generates at least two gain segment acquisitions of waveform data representative of the signal from each segment or segment lengths with each gain segment acquisition of waveform data being generated with a different receiver gain. A controller operating under program control initiates the generation of interrogating pulses, establishes the receiver gain for each gain segment acquisition of waveform data, and controls the gain segment acquisitions of waveform data over the segment or segment lengths. An event table is created containing event characterization data for each gain segment. A congruent event filter passes events having optimum characterization data for display on a display device.

23 Claims, 12 Drawing Sheets

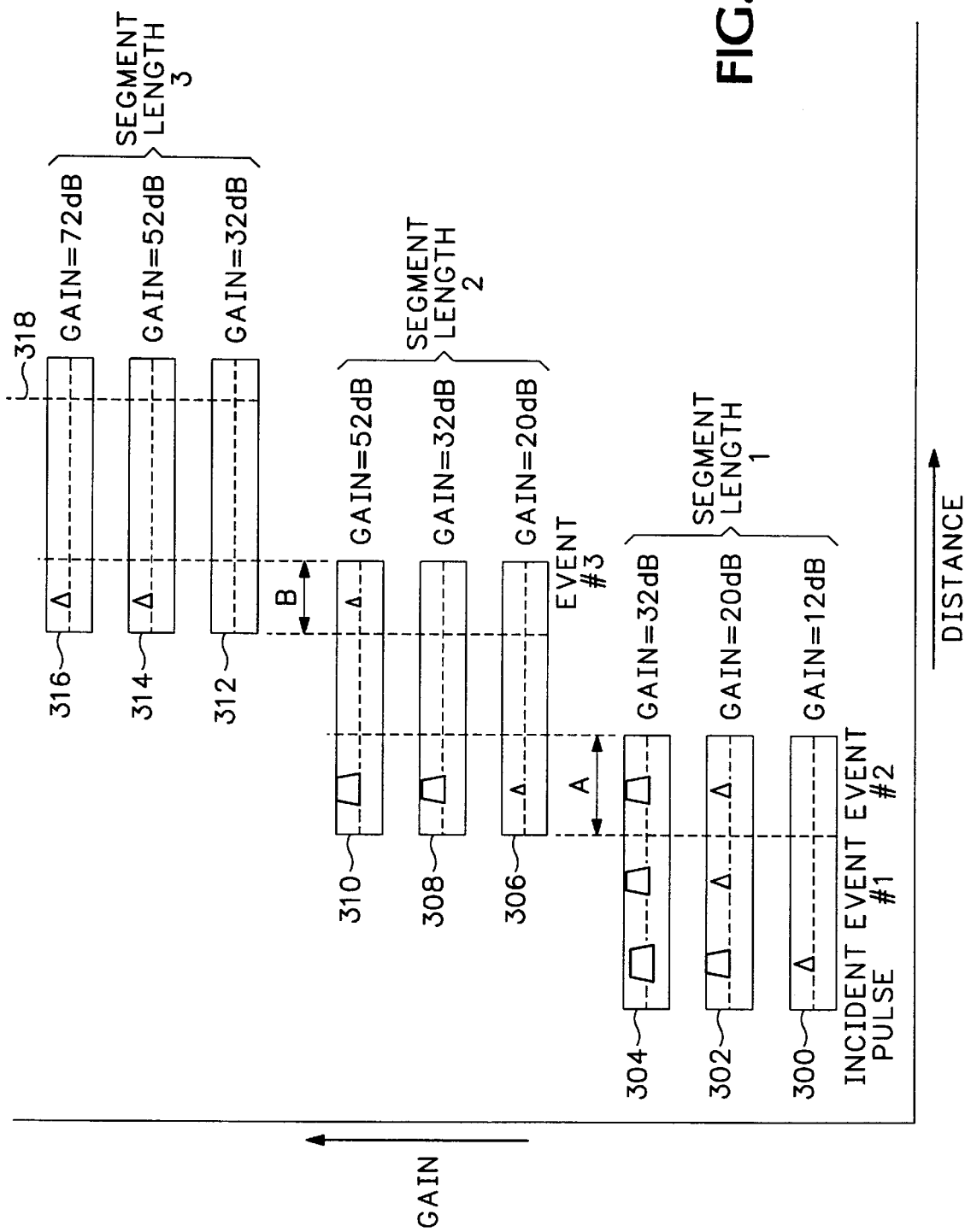

APPARATUS FOR ACQUIRING WAVEFORM DATA FROM A METALLIC TRANSMISSION CABLE

CROSS-REFERENCE TO RELATED APPLICATIONS

This application claims the benefit of the U.S. Provisional Application Ser. No. 60/048,247, filed Jun. 2, 1997.

BACKGROUND OF THE INVENTION

The present invention generally relates to the acquisition of waveform data and more particularly to an apparatus, such as a time domain reflectometer, for acquiring waveform data representative of a signal from a metallic transmission cable under test.

A time domain reflectometer (TDR) launches interrogating energy pulses into a transmission medium, such as shielded and unshielded twisted pairs, coaxial cables, and the like, at a given pulse repetition rate, depending upon the designated range of the TDR. During the periods between pulses, acquisition circuitry samples the cable to acquire data representative of reflections from flaws, discontinuities, or breaks in the cable. The reflections in the cable are timed from the time of transmission of the energy pulse to determine the range from the transmitter to such flaws, discontinuities, or breaks. Reflections may represent changes in wire gauge, splices, moisture in the cable, and the like. The acquired data is processed and displayed as a waveform trace on a display device, such as a cathode-ray-tube, a liquid crystal display, or the like.

A TDR notes any changes in the characteristic impedance of the cable under test. For a telecommunications copper facility or plant, the characteristic impedance is typically between 100 and 125 ohms. Most unshielded cables fall between 100 and 105 ohms. Shielded cable like T1 is typically about 125 ohms. Any change in the cable's impedance is displayed on the TDR display device as an upward bump, downward dip, or some combination of both deviating from a horizontal trace.

The TS100 and the TV110 Time Domain Reflectometers, manufactured and sold by Tektronix, Inc., Wilsonville, Oreg. and assignee of the instant invention, are examples of TDRs for respectively characterizing telephone twisted pair cables and coaxial cable, such as in cable television systems and the like. The TV110 automatically selects the pulsewidth of the interrogating pulse and the gain of the receiver based on the initial span of the instrument. The acquisition hardware in the TV110 acquires a single data point for each launched interrogating pulse. Timing circuitry in the acquisition hardware varies the sample strobe timing in relation to the launched interrogating pulse to acquire data points at different time intervals to build a waveform data set over the selected transmission cable span. Increasing the span causes the instrument to select a new pulsewidth and gain and to reacquire new data samples over the new range. The acquired waveform data set is displayed on a liquid crystal display device and movable cursors are provided for locating the position of displayed faults.

The TV110 acquires the waveform data at a single receiver gain setting. There is the possibility that the pre-programmed gain settings would not be large enough to detect small amplitude return events in the transmission cable. In addition, each change in span setting requires the re-acquisition of the complete waveform record over the new span. Further, an operator is required to view the displayed waveform and, based on experience, move a cursor to the location of a displayed event and place the cursor at what the user believes to be the start of the event to determine the location of the event.

U.S. Pat. No. 5,461,318 describes a time domain reflectometer having a pulse generator that generates variable amplitude interrogating pulses based on cable length. The amplitude of the pulse is dependent upon the distance to the horizontal sample being taken. If the distance is less than 1,000 feet, the transmitted pulse is 5 volts. If the distance is 1,000–10,000 feet the pulse amplitude is 7.5 volts and for a distance greater than 10,000 feet the pulse amplitude is 10 volts. The pulse height is made changeable "on the fly" such that as the distance becomes progressively longer, the transmitted pulse becomes progressively higher in amplitude, yet is limited in amplitude so as not to overdrive the TDR sampler and A/D converter. The purpose of this technique is the same as increasing the pulse width of the interrogating pulse with distance, mainly to increase the injected energy into the cable with distance. However, there is no assurance that increasing the injected energy into the cable with distance will increase the likelihood that small events will be detected in the cable.

In the field of optical time domain reflectometry (OTDR), automated waveform acquisition and event detection and characterization has progressed farther than with metallic time domain reflectometers. U.S. Pat. No. 5,155,439, assigned to the assignees of the present invention describes an optical fault locator that launches optical pulses into a test fiber at a first pulse width. The return reflected optical signal is converted to an electrical signal, digitized, stored and processed to locate anomalous events in the fiber. Any region of the test fiber having an anomalous event is reexamined using optical pulses having a pulse width optimized for the that region of the fiber. A symbolic display is used to indicate the location and type of event located in the fiber instead of the traditional waveform trace.

U.S. Pat. No. 5,528,356 describes an OTDR that acquires and stores waveform data points having multiple waveform segments with each waveform segment having data points acquired using different pulsewidths, sample spacing and starting distance. The waveform segment is defined in terms of the noise floor. The gain of the OTDR receiver amplifier may be increased for the various waveform segment acquisitions in conjunction with other parameters, such as the pulsewidth, averaging and the like, to increase the signal to noise ratio within the segment.

There are significant differences between optical time domain reflectometry and metallic time domain reflectometry. In optical time domain reflectometry, the return signal from the fiber under test is generated by Rayleigh backscattering. This means that there is a continuous return signal from the fiber even with a clean fiber having no events. Discontinuities from such things as optical connectors in the fiber appear as high amplitude positive reflective events. Reflectionless losses in the fiber appear as changes in the backscatter level. Because the return reflections and the reflectionless losses are always positive, the operating point of the A/D converter is set toward the lower limit of the device. In metallic time domain reflectometry, there is no corresponding Rayleigh backscattering as in optical time domain reflectometry. This means that a clean cable having no events would not generate a return signal. In addition, return reflections from a metallic cable may be either positive or negative based on the type of event. This requires the operating point of the A/D converter to be set at the midpoint of the AID dynamic range. This requirement essentially decreases the dynamic range of the A/D converter in a metallic TDR to one-half of that of an OTDR. Because of the limited dynamic range of the A/D converter in a metallic TDR, it has proved difficult to detect and characterize all the events in the acquired waveform data from the cable under test return signal.

What is needed is a time domain reflectometer that overcomes the A/D converter dynamic range limitations of current time domain reflectometers for acquiring waveform data representative of the return signal from a cable under test. The time domain reflectometer should acquire the waveform data in such a manner as to allow the detection and characterizations of events with low return signals. The time domain reflectometer should also acquire the waveform data over a segment length or multiple segment lengths of the cable using optimized acquisition parameters for each cable segment length. The time domain reflectometer should further display a representation of the cable under test showing the where the event occur in the cable and characterizing data on the events.

SUMMARY OF THE INVENTION

Accordingly, an object of the present invention is an apparatus for acquiring waveform data from a metallic transmission cable under test that overcomes the A/D converter dynamic range limitations of existing type apparatus.

Another object of the present invention is an apparatus for acquiring waveform data from a metallic transmission cable under test allowing the detection and characterization of low return signal level events.

A further object of the present invention is an apparatus for acquiring waveform data from a metallic transmission cable under test that acquires the waveform data over a segment length or multiple segment lengths of the cable using optimized acquisition parameters for each cable segment length.

An additional object of the present invention is an apparatus for acquiring waveform data from a metallic transmission cable under test that displays a representation of the cable under test showing the where the event occur in the cable and characterizing data on the events.

The apparatus for acquiring waveform data from a metallic transmission cable under test has a transmitter coupled to an electrical interface for generating interrogating pulses for examining a segment length of the transmission cable under test. A variable gain receiver coupled to the electrical interface receives a signal from the segment length of the cable under test for generating at least two gain segment acquisitions of waveform data representative of the signal from the segment length with each gain segment acquisition of waveform data being generated with a different receiver gain. A controller is coupled to the transmitter and the receiver for initiating the generation of interrogating pulses, establishing the receiver gain for each gain segment acquisition of waveform data, and controlling the gain segment acquisitions of waveform data over the segment length.

The transmitter includes a variable pulsewidth generator that is responsive to an input from the controller for generating an interrogating pulse having a pulsewidth optimized for the segment length of the transmission cable under test. The variable pulsewidth generator may further generate interrogating pulses having a first pulsewidth optimized for characterizing an event for resistance in the segment length of the transmission cable under test and an additional pulsewidth optimized for characterizing the event for inductance and capacitance in the segment length.

The variable gain receiver includes a variable gain amplifier that responds to inputs from the controller for varying the gain of the amplifier. The variable gain receiver also includes an analog memory coupled to receive the output from the variable gain amplifier for storing analog values of the signal from the cable under test and an analog-to-digital converter coupled to the analog memory for generating digital data values of the analog values.

The apparatus for acquiring waveform data also includes an event table containing characterization data on detected events within each gain segment acquisition of waveform data. The characterization data includes an index into the table, amplitude, start and end location values derived from the acquired gain segment waveform data, the receiver gain for acquired gain segment waveform data, the pulsewidth of the interrogating pulses for the segment length, a return loss value for the event, and a echo flag value. A congruent event filter in the apparatus determines congruent events in the respective gain segments in the event table and selects the events having optimum characterization data. A display device associated with the apparatus generates a displayed representation of the acquired waveform data over the segment length having the selected event table events being represented as part of the displayed data.

In a further embodiment of the apparatus for acquiring waveform data from a metallic transmission cable under test, the transmitter generates interrogating pulses for examining a plurality of segment lengths of the transmission cable under test with the interrogating pulses having a pulsewidth optimized for each segment length. The variable gain receiver receives a signal from the plurality of segment lengths for generating at least two gain segment acquisitions of waveform data representative of the signal for each of the plurality of segments lengths with each gain segment acquisition of waveform data for a segment length being generated with a different receiver gain. The controller initiates the generation of interrogating pulses from the transmitter, establishes the receiver gain for each gain segment acquisition of waveform data, and controls the gain segment acquisitions of waveform data over the plurality of segment lengths.

The apparatus of this embodiment includes an event table containing characterization data on detected events within each gain segment acquisition of waveform data from each of the plurality of segments lengths. The characterization data includes an index into the table, amplitude, start and end location values derived from the acquired gain segment waveform data, the receiver gain for acquired gain segment waveform data, the pulsewidth of the interrogating pulse for the segment length, a return loss value for the event and a echo flag value. A congruent event filter determines congruent events in the respective gain segments in each of the respective plurality of segment lengths in the event table and selects the events in each of the plurality of segment lengths having optimum characterization data.

The apparatus of this embodiment further includes an overlapped event table containing the selected events from the event table for each of the plurality of segment lengths having the optimum characterization data and a mosaic event table containing selected events from the overlapped event table for each of the plurality of segment lengths having the optimum characterization data. The congruent event filter determines congruent events in the respective segment lengths in the overlapped event table and selects the events having the optimum characterization data for the mosaic event table.

A display device generates a displayed representation of the plurality of segment lengths with the selected mosaic event table events being represented as part of the displayed data.

The displayed representation is generated from an additional acquisition of waveform data having an optimal sample spacing for the plurality of segment lengths and the receiver gain being set for acquiring the waveform data with event amplitudes being non-saturated and with the waveform data being scaled for the displayed representation.

The objects, advantages and novel features of the present invention are apparent from the following detailed description when read in conjunction with the appended claims and attached drawings.

BRIEF DESCRIPTION OF THE DRAWINGS

FIG. 13 is a graphical representation of three gain segment acquisitions of waveform data from multiple segment lengths in the apparatus for acquiring waveform data from a transmission cable under test according to the present invention.

DETAILED DESCRIPTION OF THE PREFERRED EMBODIMENT

The apparatus for acquiring waveform data from a transmission cable under test according to the present invention uses time domain reflectometry for acquiring the waveform data in multiple gain segments over one or more segment lengths in the cable under test. The apparatus preferably functions in multiple modes to acquire the waveform data in the multiple gain segments. One mode has greater user input for defining acquisition parameters and selecting a cable segment length while another mode requires limited user input for automatically generating the gain segment acquisitions and multiple segment lengths in the cable.

Figure 1:
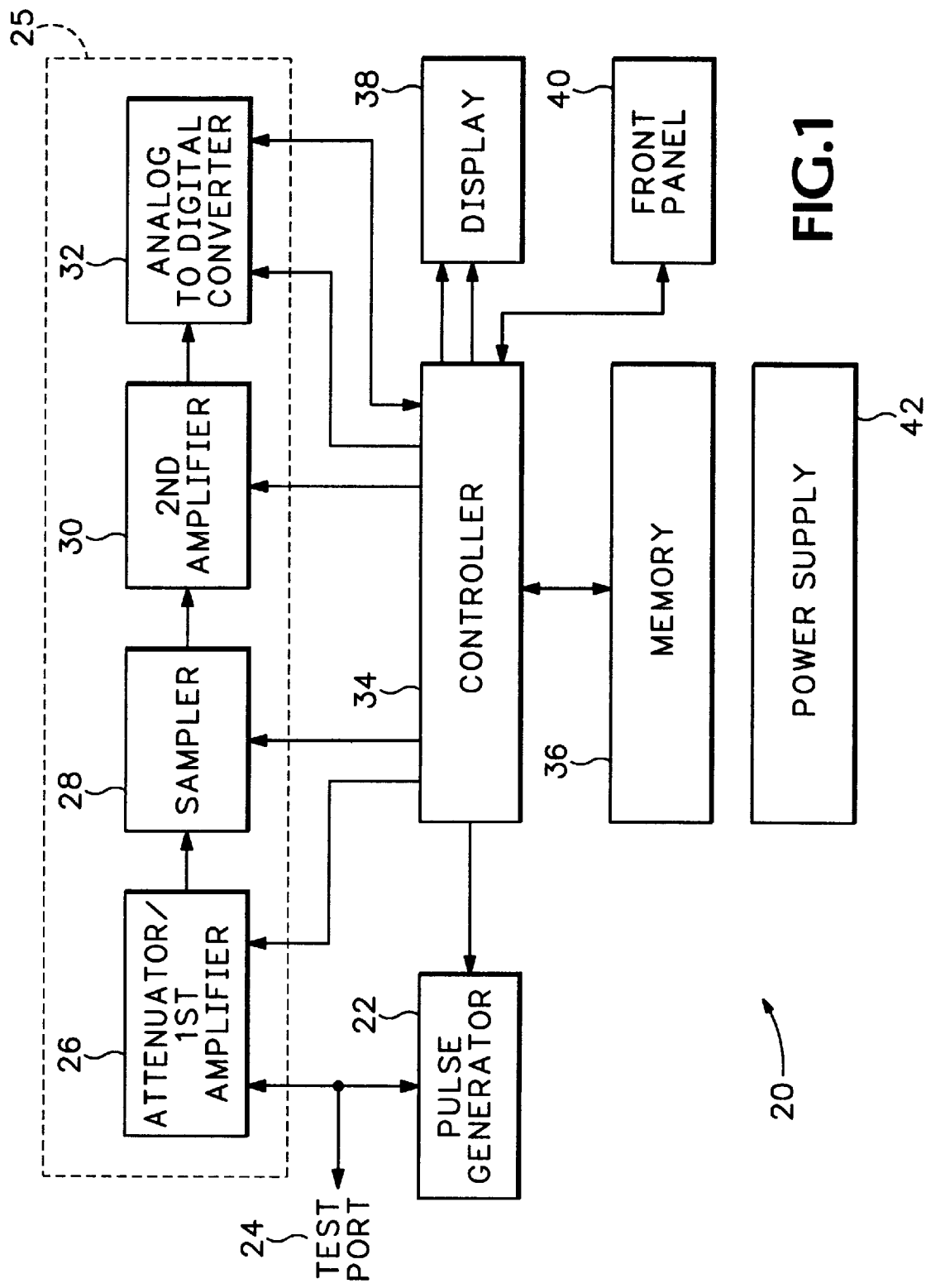
FIG. 1 is a representative block diagram of the apparatus for acquiring waveform data from a transmission cable under test according to the present invention.

Referring to FIG. 1, there is shown a block diagram of a time domain reflectometer (TDR) instrument 20 for acquiring waveform data in multiple gain segments over segment lengths of a transmission medium under test according to the present invention. A transmitter, such as a variable pulse generator or the like, 22 produces electrical interrogating energy pulses that are launched into a transmission medium under test via an electrical interface test port 24. The transmission medium may be shielded or unshielded twisted pairs, coaxial cables, or other types of metallic transmission mediums. Return electrical signal energy from events in the cable under test representing flaws, discontinuities, or breaks in the cable is coupled via the electrical interface 24 to a receiver 25 having an attenuator/first amplifier 26. The output of the attenuator/first amplifier 26 is coupled to a sampling circuit 28, such as a sample and hold circuit. The sampled analog signal is coupled to a second amplifier 30 for conditioning the sampled signal level to the appropriate level of analog-to-digital converter (ADC) 32. The ADC 32 converts the sampled and conditioned analog signal to digital values representative of the return signal from the cable under test. The digitized values are coupled to controller 34, such as a Motorolla 68330 microprocessor, for processing in the digital domain. The controller stores the digital values in memory 36 that includes flash and DRAM. Memory 36 further includes read only memory (ROM) containing programmed control instructions for controlling the acquisition functions of the TDR 20 and processing instructions for the acquired data from the cable under test. The controller 34, under program control, generates trigger pulses for the variable pulse generator 22 for initiating the generation of interrogating pulses, controls the attenuation and gain settings of the attenuator/first amplifier 26, the gain of the second amplifier 30, the timing of the sampling circuit 28 and the ADC 32 in relation to the trigger pulses, and the down loading of the ADC 32 digital date. The digital data representing the return signal energy from the cable under test is processed under program control to detect the presence of events in the cable and generate characterization data on the detected events. The digitized waveform data along with acquisition parameter data and the characterization data of the detected events are output to display device 38, such as a cathode-ray-tube, liquid crystal display, or the like. Display processing may be performed by the controller 34 or by a separate display processor (not shown) coupled to receive the processed data from the controller 34. Front panel 40 is coupled to the controller 34 and includes input devices, such as buttons, knobs, soft keys, and the like for initiating examination of the transmission medium and manually setting various TDR 20 parameters, such as the pulsewidth of the interrogating pulses, the instrument gain, sample spacing, measurement range, and the like. Power supply 42 provides operating voltages to the various circuits of the TDR 20.

The receiver 25 in TDR 20 may be viewed as a waveform digitizer similar to that used for digitizing waveforms of input signal in a conventional digital storage oscilloscope. The waveform digitizer is operated in a conventional mode known in the art as sequential sampling wherein samples, acquired from a number of repetitive signals, are later reconstructed in an equivalent time record representing one real-time signal. In the preferred embodiment of the invention, the sampler 28 in receiver 25 consists of an analog acquisition system as described in U.S. Pat. No. 5,144,525, assigned to the assignee of the instant application. The FISO (Fast-In, Slow-Out) data acquisition system is capable of sampling at sub-nanosecond intervals providing data acquisition of both periodic and non-periodic waveforms. In time-domain reflectometry applications, this allows for complete acquisition of an M×N data field with a single interrogating pulse. It further provides for very fast vertical and/or horizontal averaging and very low bit collision time (or time-out) when used in testing live LAN or other digital services. The use of a FISO data acquisition system provides for live testing of synchronous services, i.e. video resulting in no visible artifacts.

The use of the FISO data acquisition system in the TDR 20 of the present invention, because of its speed and internal design methodology, can retrieve complete and very large data fields from a single generated interrogation pulse. Since the FISO acquisition time is very small, requiring only a single interrogating pulse from the variable pulse generator 22 to collect an entire M×N sampled data field, high levels of numerical averaging can be accomplished by generating successive pulses. The end result is an increase in signal-to noise S/N by the root of the number of samples. While current TDRs may be able to average, large numerical averages cannot be accomplished in a time-frame deemed acceptable to the user and, because horizontal pixels are not sampled without generating additional interrogating pulses, horizontal averaging while using a single interrogating pulse cannot be accomplished. TDR vertical averaging is most useful in identifying minute faults at long cable distances and/or in the presence of interference noise. TDR horizontal averaging can increase time or distance accuracy of precision TDR instruments. A "running average" is performed numerically on the acquired data by the internal controller allowing an immediately viewable TDR displayed waveform with increasing S/N as the averaging process precedes with respect to time. Collecting a complete M×N sample array, which completely characterizes the cable under test with a single interrogating pulse, avoids nearly all bit collisions when characterizing a live LAN or other digital cable information. Also, for periods equal to only a single interrogating pulse, or n times the interrogating pulse (if averaging is employed) n being the number of averages, the LAN or other digital sending unit can "time-out" for this very short duration, thereby minimizing the net idle time. Advantages also exist for more synchronous applications, such as video. An entire cable can be characterized within a horizontal or vertical blanking interval when the interrogating pulse is slaved to the video synchronization signals. A further benefit of this approach is that it avoids any visual abnormalities in the active (viewed) video resulting from the generated TDR pulse.

Figure 2:
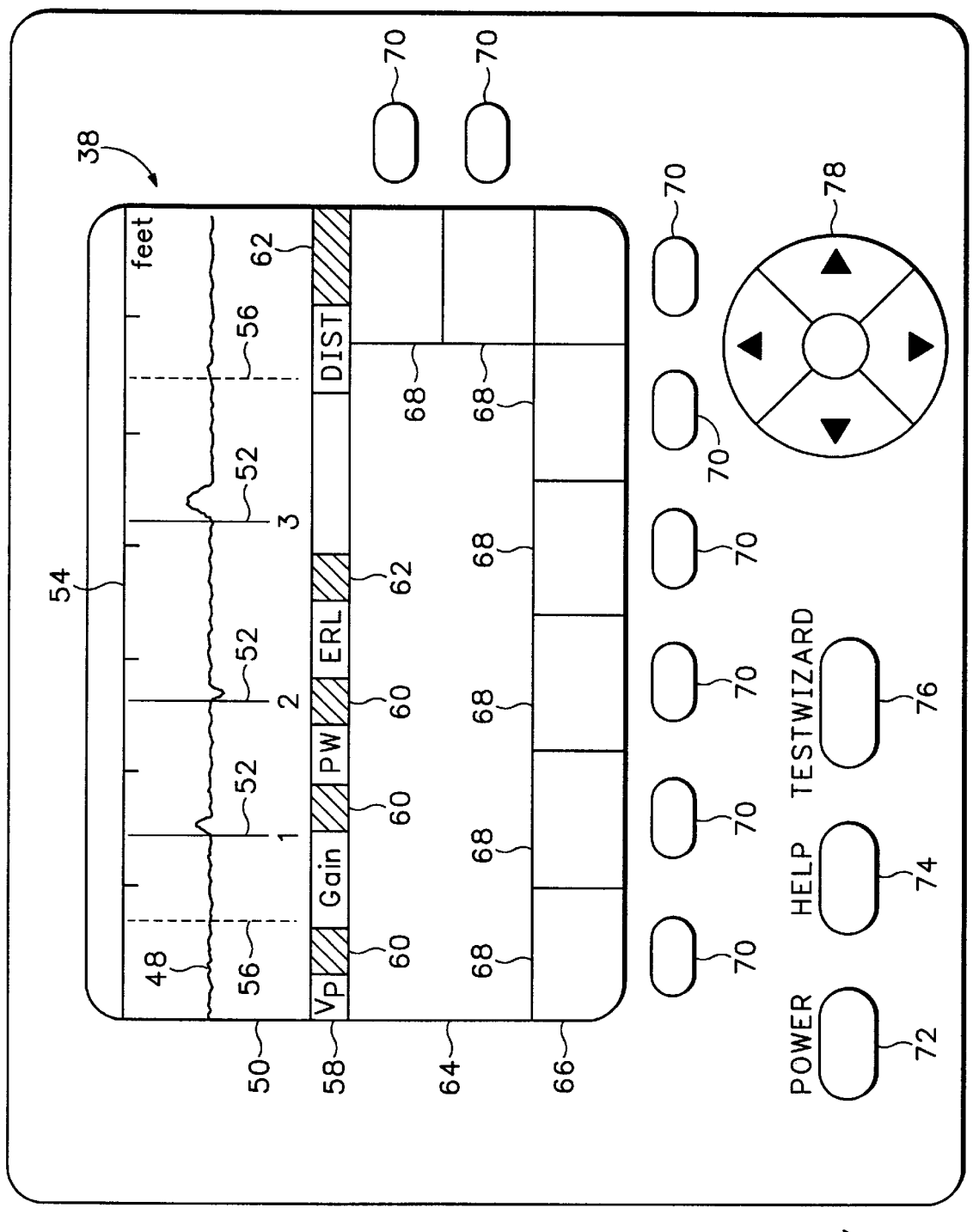
FIG. 2 is a representation of the front panel of the apparatus for acquiring waveform data from a transmission cable under test according to the present invention.

Referring to FIG. 2, there is shown a representation of the front panel 40 of the apparatus for acquiring waveform data from a transmission cable under test. The front panel includes the display device 38 which in the preferred embodiment is a 640×480 pixel liquid crystal display. The display device 38 is divided into a number of regions for presenting various type of data. The waveform data 48 is displayed in regions 50 along with identified event locations 52, a distance scale 54 and cursors 56. Below region 50 is a region 58 for displaying acquisition parameter data 60 and event characterization data 62. Region 64 displays user prompts for operating the instrument and user input information, such as cable identification data. Regions 66 contains a series of display regions 68 that indicate the type of function associated with softkeys 70 positioned on the periphery of the display device 38. The functions of the softkeys 70 and the associated display regions are controlled by the instrument software and vary depending on the instrument mode. A power button 72 turns the power on and off for the instrument. A help button 74 brings up on the display device 38 internally stored help instructions for operating the instrument. An auto test button 76 initiates the automatic gain segment acquisitions over multiple segments lengths mode and displays the resulting acquired data. Horizontal and vertical movement keys 78 are used for moving within the waveform display region 50 or to select parameters in various pull down menus.

As previously stated, the apparatus of the present invention has one mode for selecting a cable segment length and more involved user input for defining acquisition parameters. The user selects acquisition parameter settings using the front panel softkeys 70. The instrument generates a connect cable to the electrical interface 24 request on the display device 38 when the power is turned on. The span or segment length of cable to be tested and the cable type are entered along with the pulsewidth of the interrogating pulses generated by the pulse generator 22 and the gain of the receiver 25 for the displayed data. The user may also set the amount of signal averaging, a threshold value for marking events greater than the threshold as well as turning event marking on or off using the softkeys 70. The threshold value may be set in a range of 0 dB to 72 dB in the present embodiment. However, the range of the threshold value is not limited to these specific values and other threshold range values may be used without departing from the scope of the invention. The event threshold value relates to return loss (RL) of the event. Return loss and event return loss (ERL) are used for describing the loss of an event. Return loss is defined by the equation: RL=20 log(incident pulse height/ reflected event height) where the event heights are measured in any units, such as volts, pixels, ADC counts. Event return loss is calculated by finding the return loss for a particular event at a particular location or distance and subtracting out the line loss, also called cable attenuation. An open or short in the cable is the most severe passive event and should have an ERL of 0 dB at any location in the cable. In contrast, the return loss of an open or short would start at or near 0 dB at the front panel of the instrument and increase as it was moved farther from the front panel due in part to the cable attenuation.

Upon initiation of the cable examination, interrogating pulses are launched into the cable under test at a periodic rate. During the periods between the pulses, multiple gain segment acquisitions of waveform data are made over the cable segment length using different receiver gains. The initial gain setting for the first gain segment acquisition is set at 12 dB based on empirically derived noise envelope data. This lowest gain setting raises the largest ERL event far enough out the noise envelope to be detected by an event marking program. Lower gain settings are available in the system, such as 0 dB and 6 dB gain settings, but these settings would not evaluate a short or an open event above the noise floor of the current instrument design. The lower gain settings are available for use with instruments having improved noise floor characteristics. It should also be noted that the initial pulse height for the various pulsewidths of the interrogating pulses is also acquired at the 12 dB gain setting. The gain setting may be set higher as long as the pulse is linear and not saturated. A table of fixed gain settings is stored in read-only memory portion of memory 36 and contains gain settings of: 0 dB, 6 dB, 12 dB, 20 dB, 26 dB, 32 dB, 40 dB, 46 dB, 52 dB, 60 dB, 66 dB, and 72 dB and are determined by the linear dynamic range of the ADC 32. Other fixed gain settings or dynamically calculated gain settings may be employed in this invention without departing from its scope.

The steps between gain settings are determined by many factors. These factors include the linear dynamic range of the ADC 32, the level of the noise floor in the waveform, the ability of the event marking program to find events which deviate from the noise floor, the time constraint placed on the acquisition time by the user, and the highest gain setting available in the instrument. In determining the size of the gain steps, minimizing the number of acquisitions, and thus the time, was taken as the basic constraint. Minimizing the number of acquisitions results in maximizing the gain steps. The following process is used in determining the maximum steps between gain settings using an ADC with a dynamic range of 256. Because there are positive and negative events in the return signal from the cable under test, the dynamic range is halved to 128. Assuming the maximum peak-to-peak noise level over a given range is N and the event marking program can detect events that are M times N/2 or larger, then the maximum allowable gain step for acquisitions is given by the formula $20*\log(128(M \times N))$. In the actual implementation of the invention, the gain steps were chosen to be less than the maximum allowable to prevent an undetected event at one gain setting from being saturated at the next gain setting.

Figure 3:
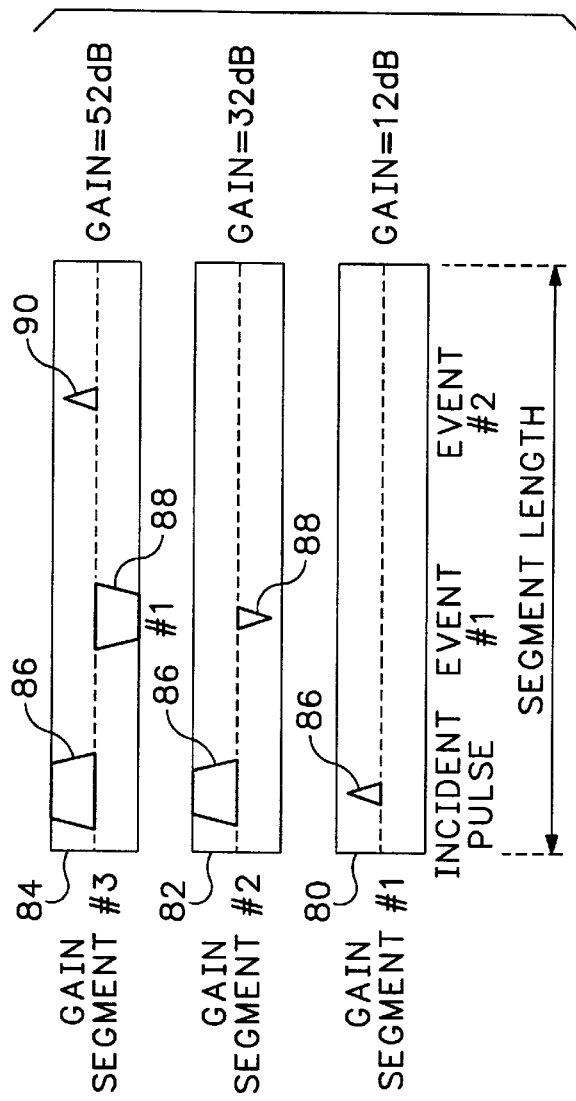
FIG. 3 is a graphical representation of three gain segment acquisitions of waveform data in the apparatus for acquiring waveform data from a transmission cable under test according to the present invention.

In the preferred embodiment of the present invention, three gain segment acquisitions of waveform data are made for each segment length. Referring to FIG. 3, there is shown a graphical representation of three gain segment acquisitions of waveform data 80, 82, and 84 over a segment length of cable. The acquisitions are made with the same beginning location and sample spacing or delta, but with different gain setting. The triangle and rombohedreal objects in the figure represent events in the cable. The triangle objects represent events that are within the dynamic range of the ADC 32 and the rombohedreal objects represent events that exceed the dynamic range of the ADC 32. Objects above the dotted lines represent events with increased impedance and those below the line represent events with decreased impedance relative to the actual or typical impedance of the cable. In the representation, the left most event 86 in the incident pulse caused by the reflection of the interrogating pulse at the instrument-cable interface and is not counted as an event. Event #1, labeled 88, is a negative impedance change event that is first detected in the second gain acquisition 82 but not at the lowest gain setting of the gain segment acquisition 80. Event #1 88 is out of range of the ADC 32 at highest gain setting of the gain segment acquisition 84. Event # 2, labeled 90, is less severe than Event # 1 88 and is only detected at the highest gain setting of the gain segment 84. The appearance and detection of events at different gain setting over the same segment length of cable is the fundamental reason why the same section of cable needs to be acquired at a range of gain settings in a system with a limited dynamic range in its ADC.

Figure 4:
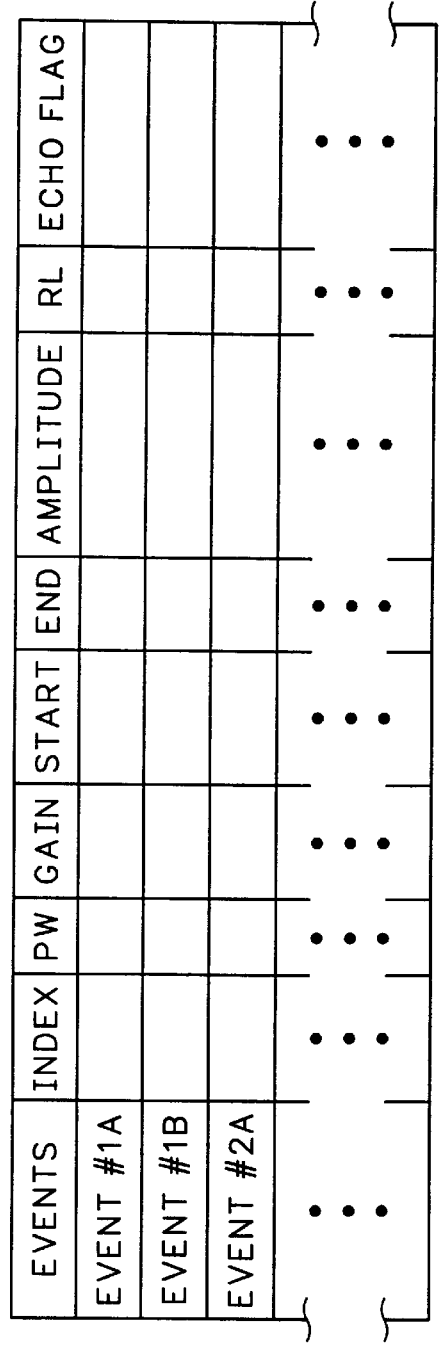
FIG. 4 is a graphical representation of an event table containing characterization data for detected events in the acquired gain segment waveform data in the apparatus for acquiring waveform data from a transmission cable under test according to the present invention.

The acquired waveform data for each gain segment is stored and events marked using an event detection program. The detected events for each gain segment are stored in an event table as representatively shown in FIG. 4 for the events in FIG. 3. The event table may be viewed as a single event table that distinguishes between the various events acquired at different gain settings or as individual tables for each gain segment acquisition. In the preferred embodiment of the invention, one event table is generated and reused for each gain segment acquisition. The event table is loaded with detected event data for one gain segment while the next gain segment waveform data is being acquired. The event data for the first segment is passed to an overlapped event table or a mosaic event table. The event data for the second segment overwrites the previously stored event data in the event table. The implemented event tables contain an index into the tables, the pulse width of the interrogating pulse, the gain setting for the marked event, the position of the event, the return loss of the event, the end or width of the event, the height of the event, and whether it is an echo. Amplitude values in the event tables are stored as ADC 32 counts or converted to volts, dBs, display pixel counts or the like. The horizontal or distance values may be stored as waveform data point counts, an index into the waveform data, time or distance in feet or meters. The waveform data point count can be multiplied by the sample spacing value, which may be a time or distance value, to give the location of the waveform data point. If the sample spacing is a time value, then the sample spacing times the velocity of propagation for the cable times the waveform data point count divided by two gives the waveform data point location. The multiplied values are divided by two to take into account the two way travel time of the interrogating pulse and the return signal in the cable. In the preferred embodiment of the present invention, the horizontal values are expressed as "x" values which are equal to 15.625 picoseconds. The method for determining whether an event is an echo is described in U.S. Pat. No. 5,373,356, assigned to the assignee of the present invention. The above listed characterization data for events in the implemented event tables provide a thorough description of the event for the user and other events tables may be generated containing less characterization data without departing from the scope of the claimed invention.

The event detection program may be implemented in a number of different ways. One such way is to calculate the slope of the waveform prior to the event and determine the peak of the event. The first derivative of each of the data points over the event is determined and compared to the slope of the waveform prior to the event. The derivative of the point that falls within a set threshold of the slope of the waveform prior to the event is taken as the stating point of the event. The event detection program used in the preferred embodiment of the present invention includes an edge detector for generating a deviation array for determining the characteristics of the event.

Figure 5:
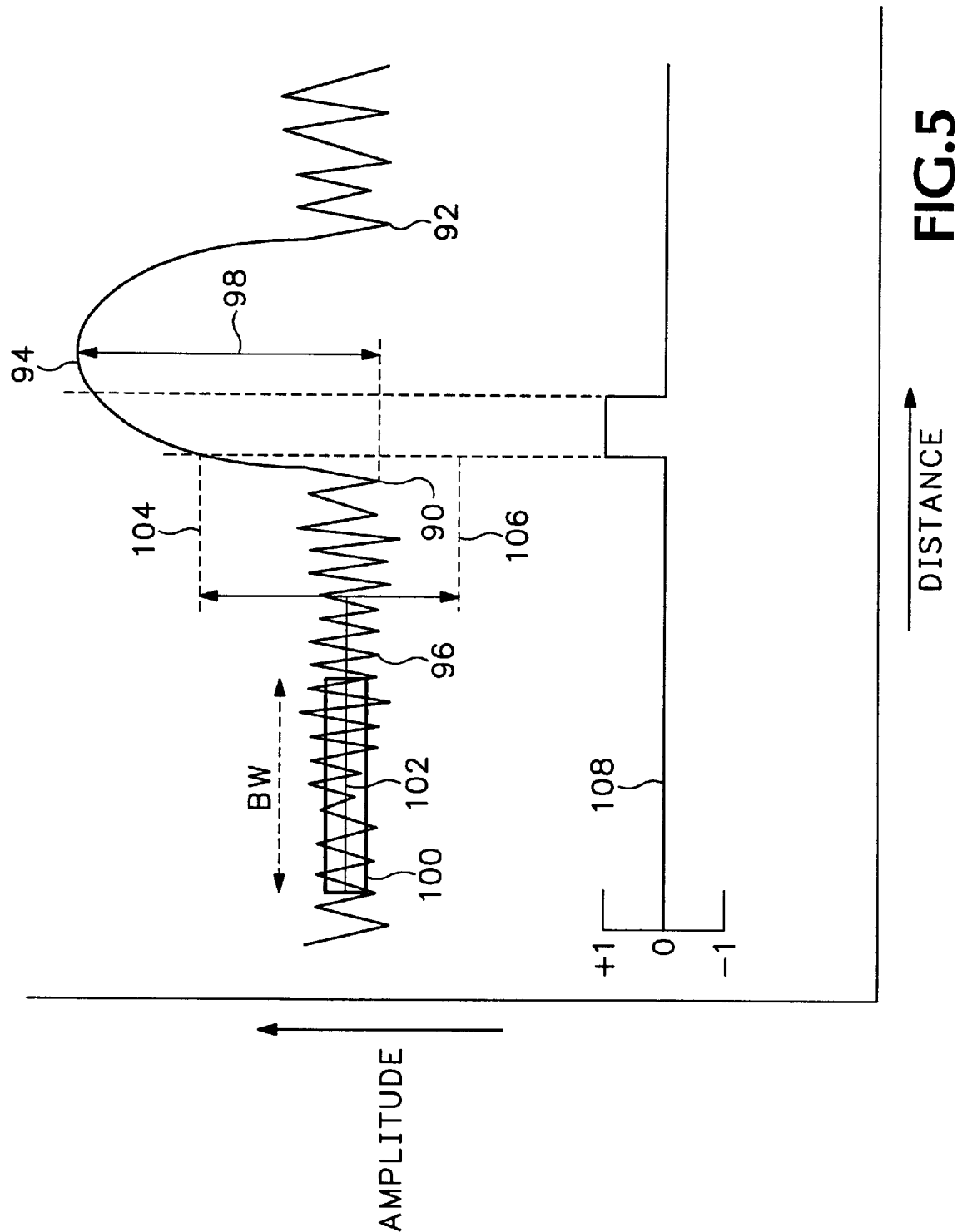
FIG. 5 is a graphical representation of an event in the acquired waveform data in the apparatus for acquiring waveform data from a transmission cable under test according to the present invention.

Referring to FIG. 5, there is a graphical representation of an event in the acquired gain segment waveform data showing pertinent points in the data for characterizing the event. The event includes an elbow point 90 defined as the point of maximum bend at the beginning of the event and an end point 92 defined as the point of maximum bend at the end of the event. The peak-valley point 94 of the event is defined as the highest point for a positive going event or the lowest point for a negative going event. The noise floor 96 is defined as a section of waveform data that is assumed to be free of events. The height 98 of the event is defined as the vertical distance between the elbow point and the peak-valley point. An event or edge detector 100 is representatively show as a box in the figure having a constant width BW. A line 102 drawn through the edge detector 100 and the noise data represents the average of all the points within the box 100 and is called the Box Average. The dashed horizontal lines 104 and 106 above and below the noise data respective represent top and bottom thresholds that are compared to the waveform data. A deviation array as represented by line 108 is generated when the waveform data exceeds these thresholds 104, 106.

The event marking program contains a number of constant tuning parameters which are stored in memory 36 ROM. The tuning parameters are written in all capital letters with underscore delimiters and are described as follows.
Define
WfmData Type MAX_RETURN_LOSS_ALLOWED= 124:
Absolute value of the Return Loss is filtered to this amount.
Constants
WfmData Type MULTIPLE_THRESH=5:
Determines the number of box heights the waveform must go above (below) the top (bottom) of the Box to cause a deviation to be marked.
wfmData Type MIN_BOX_THRESH=5:
The smallest the box threshold is allowed to become. This protects against the no noise situation where the box height is zero.
Integer BOX_HALFWIDTH=10:
The width of the box inside which the waveform's average deviation is calculated; and (a half of a box width) in front of which the waveform is checked for deviation from the starting and ending halfwidth of the boxes which are moved along the waveform to find deviations; these deviations are then grouped into regions.
Integer REGION_MIN_WIDTH=1:
The minimum region width should roughly scale linearly with box width.
Integer SATURATED_EVENT_FACTOR=2:
When an event is saturated it takes time for electronics to unsaturate; this widens events; this factor is used to widen the estimated event width; the widening occurs by adding SATURATED_EVENT_FACTOR times the distance from the elbowPoint to where the event goes below (above) the SATURATION_TOP (BOTTOM)
WfmData Type SATURATION_TOP=240
When the waveform goes above this value, it is saturated.
WfmData Type SATURATION_BOTTOM=15
When the waveform goes below this value, it is saturated.
Integer FIND_ELBOW_LINE_FACTOR=2:
This constant is used to determine where to locate the left most point for the line used to find the elbowPoint of a region. The factor times the regionWidth is how far the algorithm goes backwards from the beginning of the region to the left most point for a line used to find the elbowPoint.
(Note; if the region is not filtered out and becomes an event then this elbowPoint is the beginning of the event)
Integer FIND_PEAK_VALLEY_FACTOR=2:
This constant is the number of regionWidths we look forward from the end of the region to find the peakvalleyPoint.
Integer MIN_PIXEL_LOSS_HEIGHT=2:
wfmDataType OFF_THE_CLIFF_HEIGHT=235
wfmDataType OUT_THE_VALLEY_HEIGHT=20

NOTE: Closely related to SATURATION_TOP (BOTTOM) limits for the OFF THE CLIFF OR OUT OF THE VALLEY FILTER the event edge detector catches the end or backside of a saturated event and these "false" events are filtered by looking at the height of the elbowPoint. If it falls outside of these limits, then the event is filtered.
Integer INCIDENT SKIP FACTOR=3:
This factor is multiplied by the width of an incident pulse to determine how far past the zero point of the waveform to start event marking.
Integer PARTIALLY_CONTIGUOUS_TOLERANCE=3:
This quantity is added to the sum of the widths of two regions which is used to determine whether two adjacent events are partially contiguous.
Integer MIN_BETWEEN_REGIONS=10:
Partially contiguous regions are defined to be two regions which are within the larger of either the sum of their widths (plus PARTIALLY_CONTIGUOUS_TOLERANCE or MIN_BETWEEN_REGIONS of each other).

Figure 6:
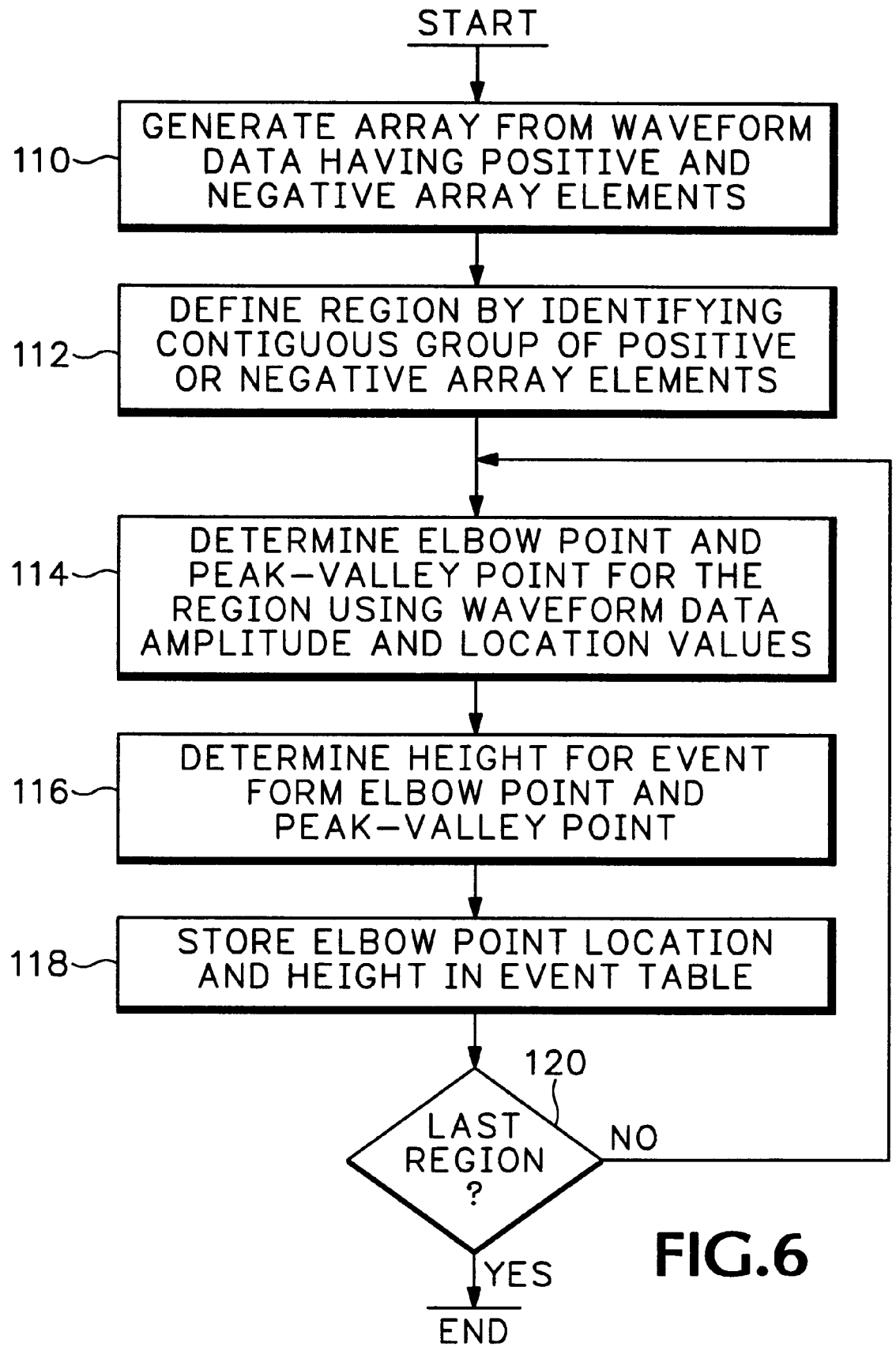
FIG. 6 is a flow chart showing the steps in an event detection program for characterizing an event in the acquired waveform data in the apparatus for acquiring waveform data from a transmission cable under test according to the present invention.

The event detection program as shown in the flow chart of FIG. 6 uses the event detector 100 to generate an array, as shown in step 110, representative of the event in the acquired data. This array is called a deviants array and contains +1 array elements representing the leading edge of positive events and −1 array elements representing the leading edges of negative events. The deviants array is searched to identify contiguous groups of+1 and −1 which are respectively logged as positive and negative going regions as indicated in step 112. The elbow point and the peak-valley point for the region is determined using the location and amplitude values of the pertinent waveform data points as shown in step 114. The height of the event is determined by subtracting the elbow point value from the peak-valley point value as depicted in step 116. The elbow point location and the height of the event are stored in the event table as shown in step 118. Each of the defined regions are characterized and the pertinent data is stored in the event table as shown by the decision step 120.

Figure 7:
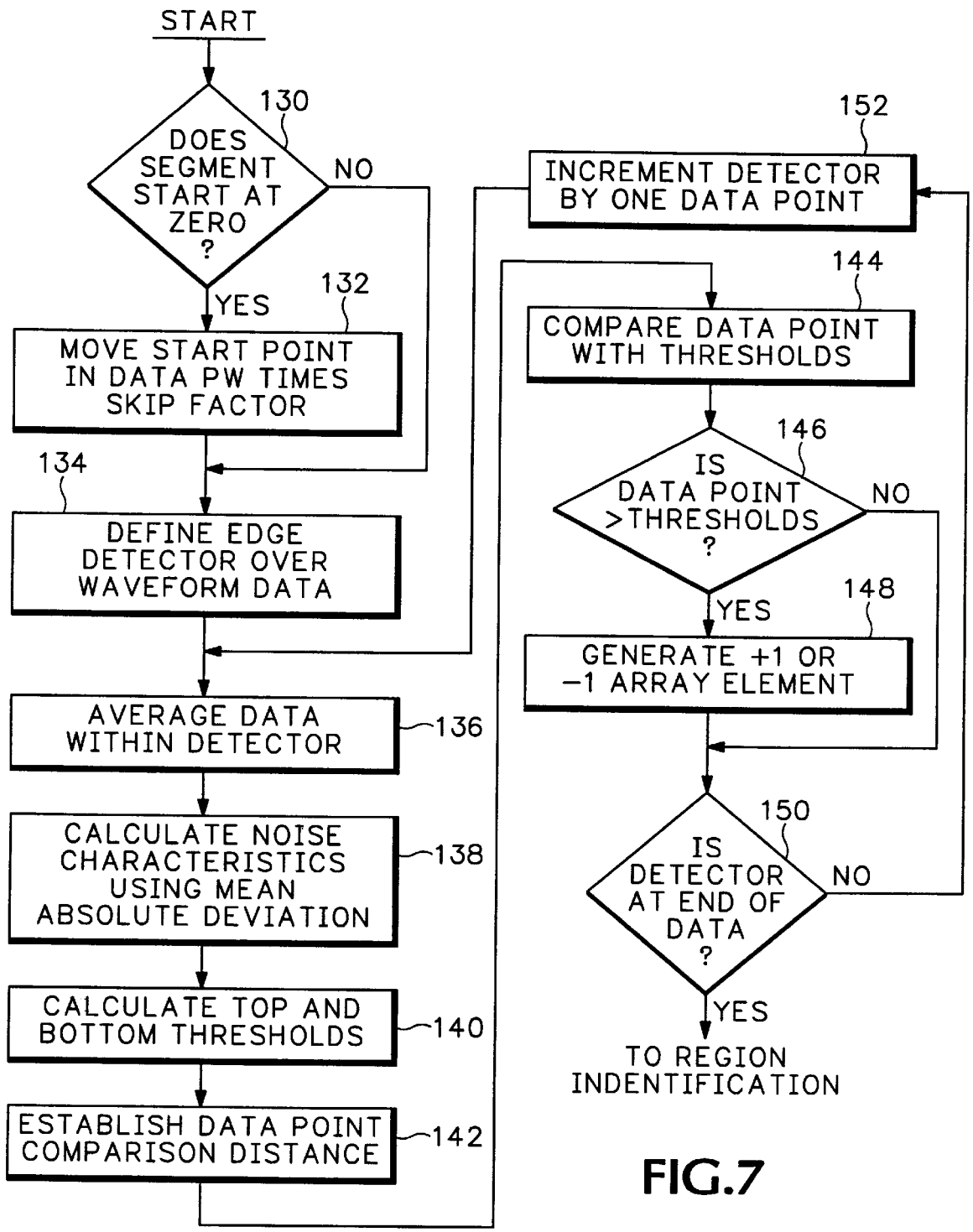
FIG. 7 is a flow chart showing the steps in generating a deviants array in the event detection program in the apparatus for acquiring waveform data from a transmission cable under test according to the present invention.

Referring to the flow chart of FIG. 7 and FIG. 5, a starting point is established in the waveform data for generating the deviants array. As previously stated, the incident pulse is not considered an event and therefore is not marked. If the span of the waveform segment starts at zero as shown in step 130, the system moves the starting point in the waveform data for the event marking program a distance equal to the INCIDENT_SKIP_FACTOR times the incident pulse width as shown in step 132. This moves the start of the event detection program past the incident pulse. The edge detector 100 in FIG. 5 is defined having a constant width equal to twice the BOX_HALFWIDTH and contains waveform data points for locating regions of the waveform data which may contain the leading edge of an event as shown in step 134. The Box Average 102 is calculated from the waveform data within the detector as shown in step 136. Within the detector 100, the noise characteristic of the waveform data is calculated using the Average Deviation (also called the mean absolute deviation) of the waveform as shown in step 138. The average deviation differs slightly from standard deviation in that the average deviation is less susceptible to outlier data points than the standard deviation. The average deviation is give by the following equation:

$$Adev(N) = (1/N) \sum_{j=1}^{N} |\lambda_j - \overline{\lambda}|$$

where N is the number of data points and $\lambda_j$ is the value of the jth data point. The Average Deviation is used as a local estimate of the noise characteristics of the waveform. The top and bottom thresholds 104 and 106 are determined as shown in step 140 and compared with the waveform data points to generate deviants array elements 108. The top threshold 106 is defined as a distance equal to the Average Deviation times the MULTIPLE_THRESH above the Box Average 102. The bottom threshold 106 is this same distance below the Box Average 102. A MIN_BOX_THRESH is set to prevent the thresholds from becoming zero for no noise situations where the Average Deviation would be zero. A data point distance in front of the edge detector 100, defined as the BOX_HALFWIDTH, is established for comparing the threshold values with the waveform data point amplitude values as shown in step 142. The waveform, at the BOX_HALFWIDTH distance in front of the detector 100, is checked for deviations above the top threshold 104 or below the bottom threshold 106 as shown in step 144. If the waveform is found to deviate above the top threshold 104, then a+1 is entered into the deviants array 108. If the waveform is found to deviate below the bottom threshold 106, then a−1 is entered into the deviants array 108 as shown in steps 146 and 148. For the position of the edge detector 100 shown in FIG. 5 the waveform does not deviate. The edge detector 100 increments through the waveform data point by point starting from the first acquired data points to the last acquired data points (left to right in the figure) as indicated in steps 150 and 152. In the case shown in FIG. 5, when the edge detector 100 moves forward about 10 data points from its present location, the waveform exceeds the top threshold 104. The waveform continues to exceed the top threshold 104 for the next five or more data points creating a contiguous group of +1's in the deviants array 108. The beginning of this group is labeled begin region and the end is label end region. Once the right edge of the edge detector box 100 reaches the elbow point of the event, the Average Deviation will increase. This pushes the top threshold and bottom threshold higher and lower, respectively, and avoids marking of the trailing edge in the deviants array. It also avoids marking deviations in more complicated events which can have multiple oscillations of varying amplitude.

Figure 8:
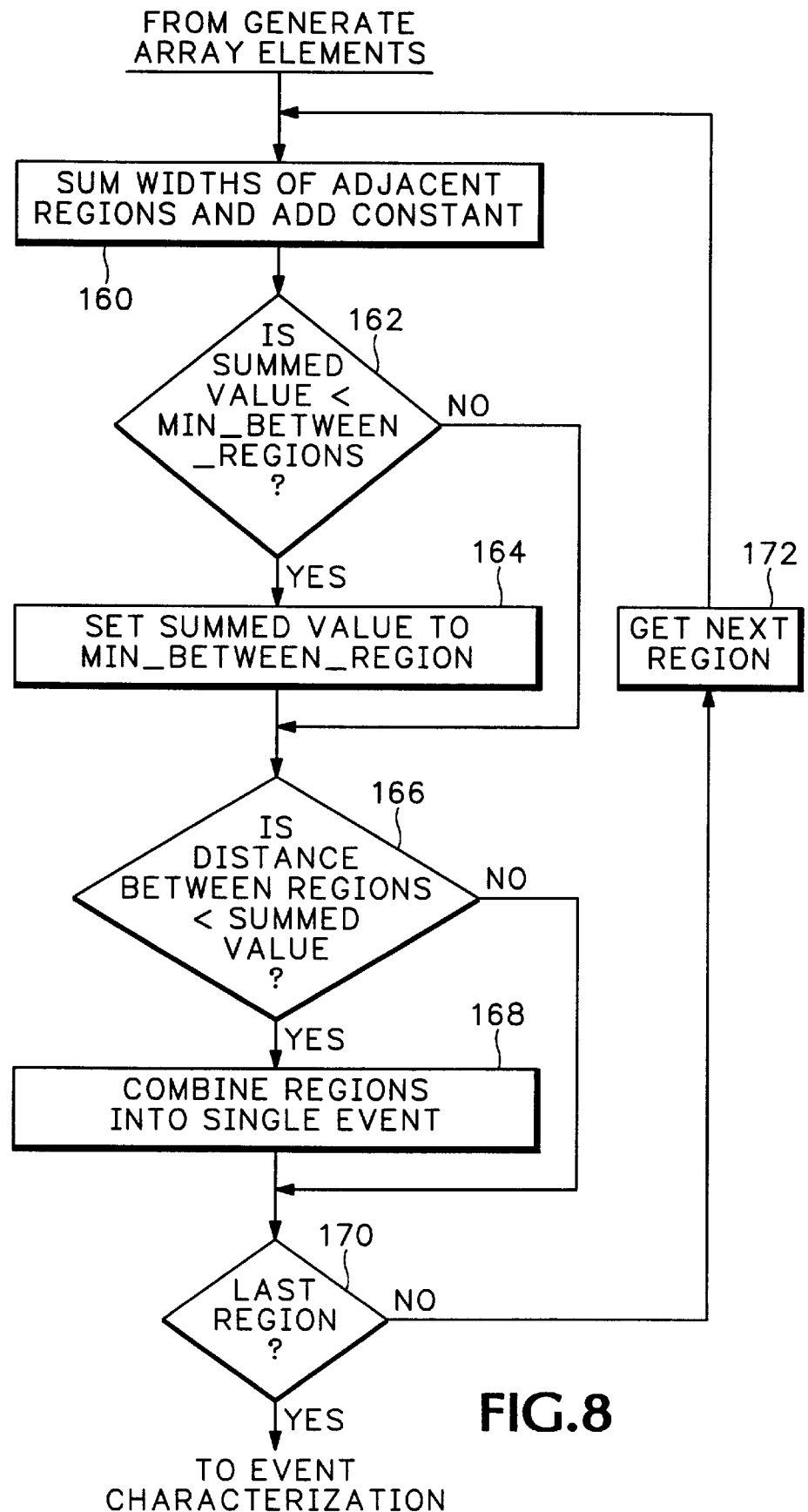
FIG. 8 is a flow chart showing the steps in identifying contiguous regions in the deviants array in the detection program in the apparatus for acquiring waveform data from a transmission cable under test according to the present invention.

Referring to the flow chart of FIG. 8, the various regions are examined to define predominantly contiguous regions of closely grouped regions. Predominantly contiguous regions are determined using the PARTIALLY_CONTIGUOUS_TOLERANCE and the MIN_BETWEEN_REGIONS constants. The PARTIALLY_CONTIGUOUS_TOLERANCE constant is added to the sum of the widths of two adjacent regions as shown in step 160. If the summed value is less than the MIN_BETWEEN_REGIONS, then the summed value is set to the MIN_BETWEEN_REGIONS constant as shown in steps 162 and 164. If the distance between the two regions is less than the summed value of their widths plus the PARTIALLY_CONTIGUOUS_TOLERANCE constant or the MIN_BETWEEN_REGIONS constant, then the regions are considered contiguous and are combined into one region and given the type of the first region as shown in steps 166 and 168. For example, a leading positive going region of 10 array elements is separated by a count of 20 from a negative going region of 20 array elements. The sum of the regions plus the PARTIALLY_CONTIGUOUS_TOLERANCE constant is 33. The count between the events is less than the summed value, so the events are considered contiguous and the two events are combined into one and stored as a positive event. If the regions are not partially contiguous and it is not the last region, the next region in the array is processed using the same steps with the previous region for congruency as shown by steps 170 and 172. After the congruent regions have been defined, the regions are examined for characterizing the event.

Figure 9:
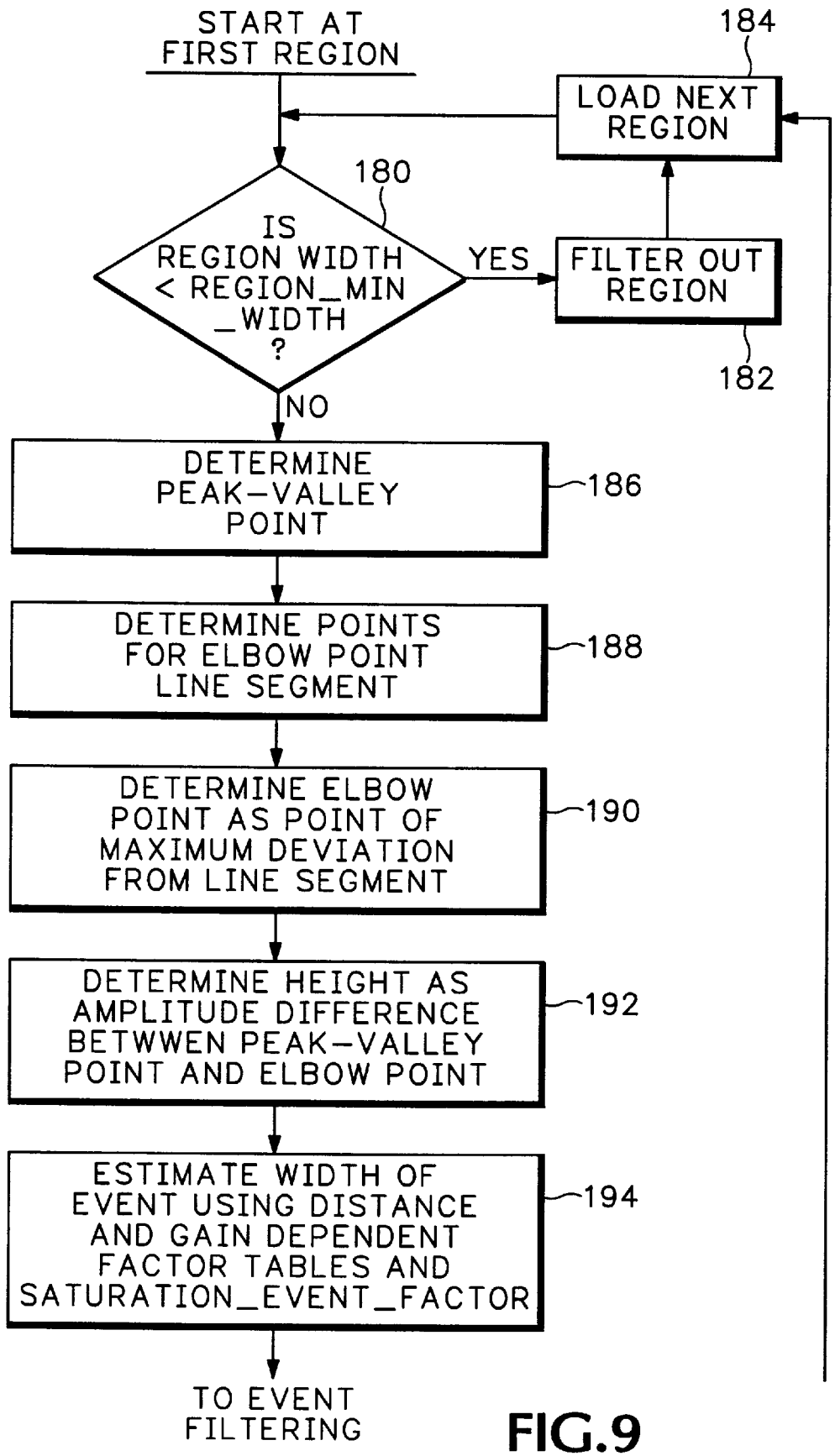
FIG. 9 is a flow chart showing the steps in producing characterization data of an event in the event detection program in the apparatus for acquiring waveform data from a transmission cable under test according to the present invention.
Figure 10:
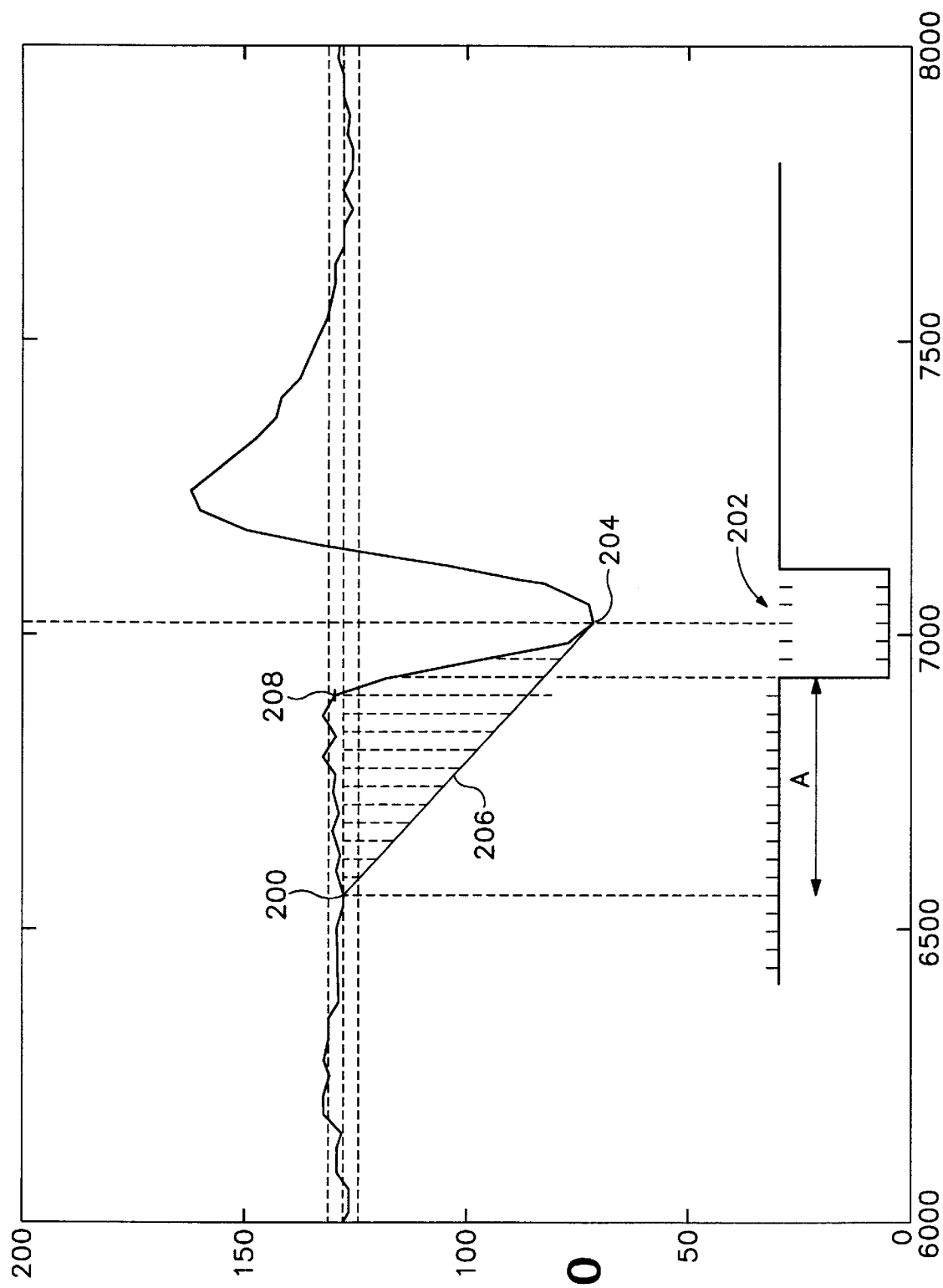
FIG. 10 is a graphical representation of an event in the waveform data showing the mathematical construction for determining the elbow point of the event in the event detection program in the apparatus for acquiring waveform data from a transmission cable under test according to the present invention.

Referring to FIG. 9, the first step in the region examining process is filtering the regions in the deviants array 108 that have a region width less than the REGION_MIN_WIDTH as shown in steps 180 and 182. If the region is filtered the next region is loaded as shown in step 184 and checked for the minimum width. For regions having the required region width, the peak-valley point of the region is determined as shown in step 186. For a positive region the peak-valley point is the highest point in the section of waveform starting at the beginning of the region and ending at FIND_PEAK_VALLEY_FACTOR region widths to the right. For a negative region it the lowest point in that section. The elbow point of the region is defined to be the point of maximum deviation of the waveform from a line segment drawn between two points on the waveform defined as follows: the first point is found by moving backward from the beginning of the region a distance equal to the larger of either FIND_ELBOW_LINE_FACTOR times the region width or the BOX_HALFWIDTH. The second point is the left most of either the middle of the region or the peak-valley point. The elbow determination process is shown in steps 188 and 190 and is graphically shown in the event of FIG. 10. The first point 200 is defined by taking the region width 202, which is 6, times the FIND_ELBOW_LINE_FACTOR of 2 which is 12 as shown by line marked A. The BOX_HALFWIDTH equals 10 in the preferred embodiment. The second point 204 is the peak-alley point, which in this example happens to coincide with the middle of the region 202. A line 206 is mathematically determined between the points 200 and 204 and the deviation between each waveform data point within the points 200 and 204 and the line is determined. These are shown as vertical dashed lines in FIG. 10. Waveform data point 208 has the maximum deviation from the line and is considered the elbow point. The height of the event is the vertical distance between the elbow point and the peak-valley point as shown in step 192. The width of the event is estimated by the pulsewidth times a distance and gain dependent factor as shown in step 194. Table 1 and Table 2 below respectively show the distance and gain dependent factors.

TABLE 1

| Distance in feet | Distance Factor |
| --- | --- |
| 50.0 | 1.5 |
| 100.0 | 1.5 |
| 400.0 | 2.0 |
| 1000.0 | 2.0 |
| 2000.0 | 3.0 |

TABLE 2

| Pulsewidth | Gain in dB | Gain Factor |
| --- | --- | --- |
| PW0 | 12 | 1.0 |
| PW0 | 32 | 1.5 |

TABLE 2-continued

| Pulsewidth | Gain in dB | Gain Factor |
|---|---|---|
| PW0 | 52 | 2.0 |
| PW0 | 100 | 4.0 |
| PW1 | 12 | 1.0 |
| PW1 | 32 | 1.5 |
| PW1 | 52 | 1.5 |
| PW1 | 100 | 3.0 |
| PW2 | 12 | 0.5 |
| PW2 | 32 | .075 |
| PW2 | 52 | 2.0 |
| PW2 | 100 | 2.0 |

The widths of an event is a function of the pulsewidth of the interrogating pulse. Events farther out in the cable tend to be wider than events closer to the instrument. The width of an event also increases as a function of the receiver gain. The width of the event increases along with the receiver gain. For these reasons, distance and gain dependent factors are used for estimating the width of the event and the end point of the event. If the distance of the event is less than 50 feet from the instrument, the distance factor is 1. From 50 feet to less than 100 feet, the distance factor is factor is 1.5. From 100 feet to less than 400 feet, the distance factor is 1.5 and so on as shown in Table 1. The gain factor table takes into account the pulse width of the interrogating pulses and the gain of the receiver. In the preferred embodiment of the invention, the pulsewidth PW0=4.00 nanoseconds, pulsewidth PW1=6.00 nanoseconds, and pulsewidth PW2=25.00 nanoseconds. Other interrogating pulsewidths may be used with corresponding changes to the distance and gain factor tables without departing from the scope of the present invention. For receiver gain up to 12 dB, the gain factor for the respective pulsewidths are 1.0, 1.0 and 0.5. For receiver gains greater than 12 dB and equal to 32 dB the respective gain factors are 1.5, 1,5 and 0.75 and so on as shown in Table 2. The estimate width of the event is determined by multiplying the pulsewidth of the interrogating pulse that the waveform data is acquired at time the distance factor and multiplying this result by the gain factor for the gain at which the waveform data was acquired at. The resultant estimated pulsewidth is added to the elbow point value to estimate the end point of the event. Alternately, the estimated pulsewidth of the event can be stored in the event table and the end point calculated from by adding the estimated pulsewidth to the beginning of the event.

Figure 11:
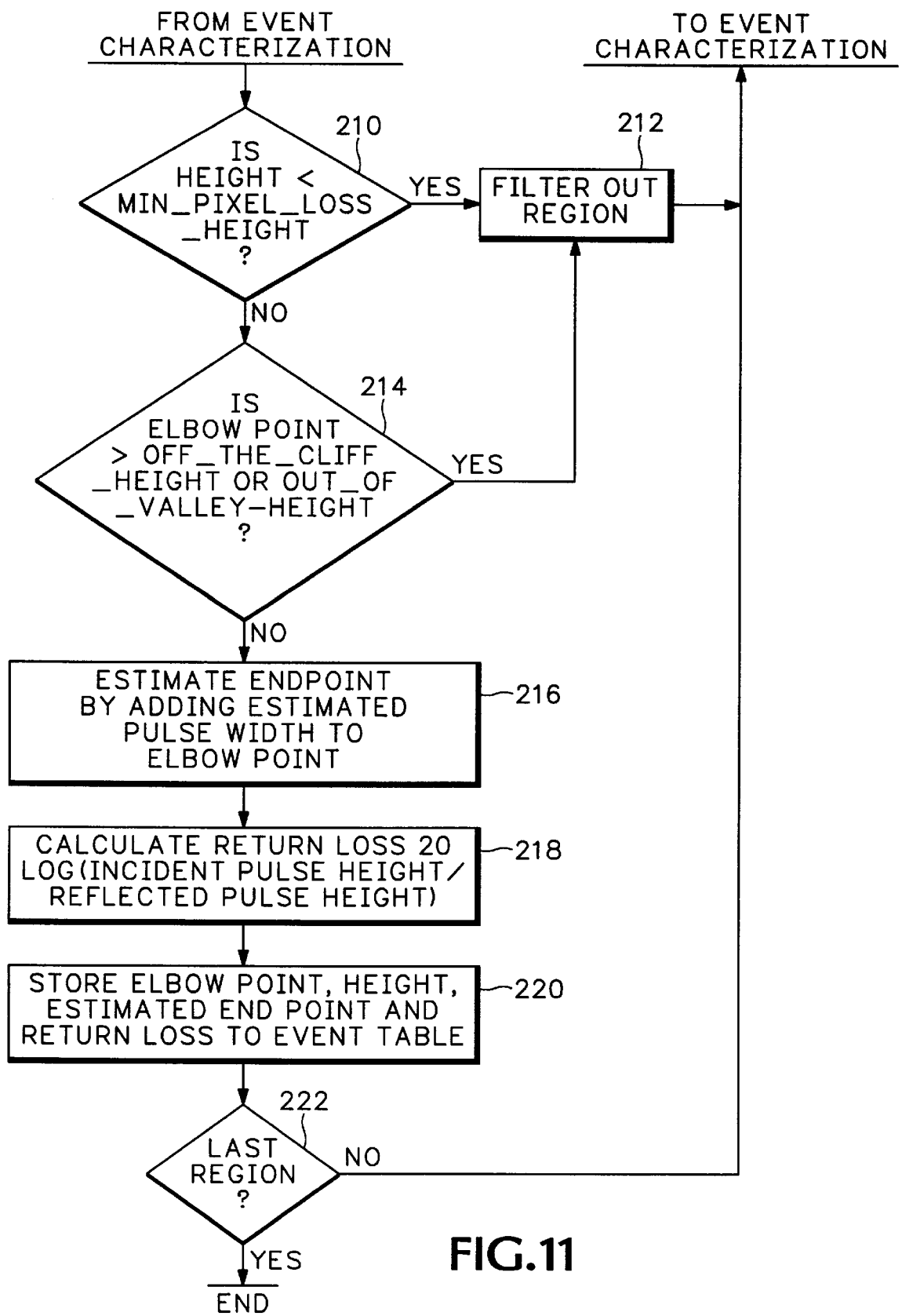
FIG. 11 is a flow chart showing the steps in event filtering and data storing in the event detection program in the apparatus for acquiring waveform data from a transmission cable under test according to the present invention.

Referring to FIG. 11, the event is filtered out if the height of the event is less than MIN_PIXEL_LOSS_HEIGHT as shown in steps 210 and 212. When an event saturates the receiver electronics, it takes time for the electronics to unsaturate. This widens the event. The SATURATED_EVENT_FACTOR is used to widen the estimated width of the saturated events by adding the SATURATED_EVENT_FACTOR times the distance between the elbow point of the event and the point where the event goes below the SATURATION_TOP for positive events or above the SATURATION_BOTTOM for negative events. The region is filtered out if the elbow point is higher than OFF_THE_CLIFF_HEIGHT or lower than the OUT_OF_VALLEY_HEIGHT as shown in step 214 and 212. This filters out saturated events which can have large, flat areas on the top or bottom. Alternately, the saturated events can be stored in the event table and a congruent event filter, to be described below, can filter out the saturated events. When an event is filtered out, the next region is loaded as shown in step 188 of FIG. 9 and the event characterized. The remaining non-filtered regions are considered valid events and are promoted to a potential event. An estimate of the end point of the event is determined by adding the estimated pulsewidth to the elbow point as shown in step 216. The return loss of the event is calculated using the formula RL=20 log(incident pulse height/reflected event height) as shown in step 218. The elbow point, height of the event, the estimated end point and the return loss are loaded into the event table as shown in step 220. Alternately, the estimated pulsewidth may be loaded into the event table instead of the estimated end point and the estimated end point is calculated from the event table characterization data by adding the estimated pulsewidth to the elbow point. The characterization process is performed on each of the regions in the deviants array as shown by step 222.

Figure 12:
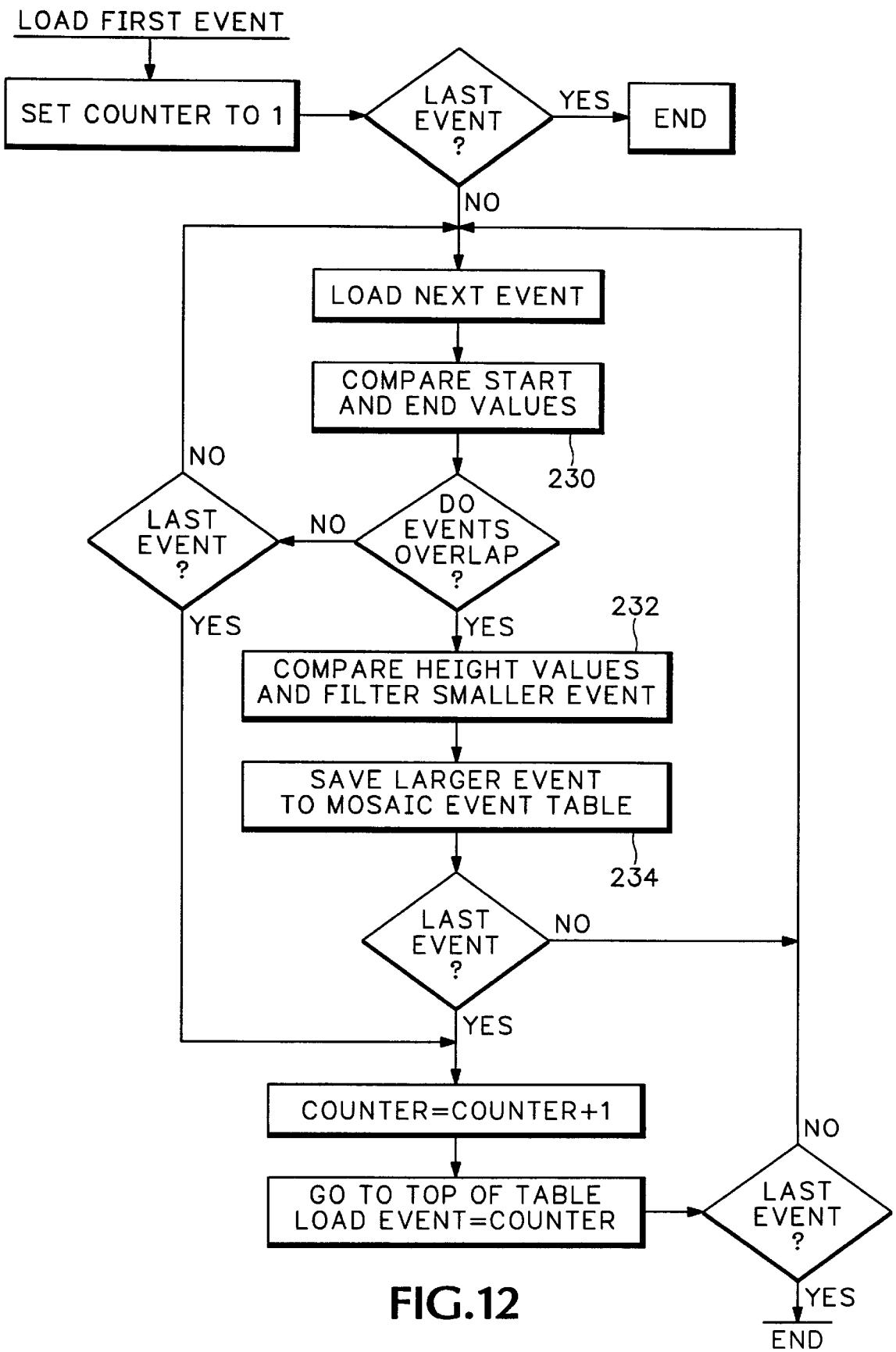
FIG. 12 is a flow chart showing the steps of the congruent event filter in the apparatus for acquiring waveform data from a transmission cable under test according to the present invention.

If event marking is on, congruent events in the event table are detected and filtered using a congruent event filter to produce a single event at a particular location as shown in the flow chart of FIG. 12. The filter compares the start and end points of events to determine if any of the events are overlapped as shown in step 230. If two or more events are found to overlap, the heights are compared as shown in step 232 and the largest height event is saved to a mosaic event table containing the same characterization data as the event table of FIG. 4 as shown in step 234. As shown by the decision steps and counter, all of the events are compared to each other to determine if any are congruent. The saved events in the mosaic event table have the optimum characterization data for the filtered events at a particular location.

An additional acquisition of waveform data is made at the gain/span setting initially input by the user and processed by the controller 34 for display on the display device 38. The acquired waveform data contains 634 data points, which is equal to the number of displayable horizontal pixel locations on the display 38. Event data from the mosaic event table is used to identify the location and characteristics of the events on the display even if the event is not visible on the display because of the user selected gain setting.

The automatic acquisition mode will be described in relation to Table 3 in Appendix A. In the automatic acquisition mode, the acquired waveform data has 2500 data points. The acquisition hardware for the TDR 20 acquires samples of the return signal from the transmission cable under test at a 500 picosecond rate. Depending on the velocity of propagation $V_P$ in the cable, for example a $V_P$ of 0.88, this is equivalent to the acquisition hardware acquiring samples every 0.216 ft. of the cable thus covering a distance of approximately 541 ft. A delta or sample spacing value of 16 is assigned to this acquisition rate. In the preferred embodiment, the delta values are incremented in powers of 2. Thus, if the delta value is increased to 32, then the sample spacing is 1 nanosecond producing 2500 acquired waveform data covering a cable distance of approximately 1082 ft. If the delta value is decreased to 8, then the sample spacing is equivalent 250 picoseconds covering a cable distance of approximately 271 ft. However, the acquisition hardware maximum acquisition rate is 500 picoseconds. For a delta of 8, the number of data points acquired would be approximately 1250. To increase this number to the 2500 acquired waveform data points requires interpolating between the sampled data points. A sin(X)/X function is used to generate line segments between the data points. For a delta of 8, it is necessary to double the number of acquired data points to produce the necessary 2500 acquired waveform data points by extrapolating data points in between the acquired data points. The extrapolated data points are evenly distributed between the acquired data points along the sin(X)/X line segments. If the delta is changes to 4, then four times the number of acquired data points are necessary to produce 2500 acquired waveform data points. If the delta is changed to 1, then sixteen times the number of acquired data points are necessary to produce 2500 acquired waveform data points. Table 3 shows this relation for a $V_P$ of 0.88 and various pulsewidths, gains, and distances for an event in the data. Information on the acquisition rate of the hardware, the gain settings, the pulsewidths of the interrogating pulses, and the range along with the velocity of propagation of the transmission cable are used to generate values for determining the optimum delta for the various determinable factors. Table 3 shows values for determining the optimum delta for propagation velocity of $V_P$ of 0.88. The data necessary for the generation of the values are the DT values, the pulsewidths, the gains, the distances and the extrapolation factors ExF. From the values generated, an optimum delta table, as shown is Table 4, is generated for determining the optimum delta based on the conditions that the actual data points over the event for the lowest gain setting is greater than 8 and the number of extrapolated data points over the event is greater than 40.

TABLE 4

OPTIMUM DELTA TABLE

| PWN | Gain | DIST (ft) | Optimum Delta |
|---|---|---|---|
| 0 | 12 | 50.000 | 8 |
| 0 | 12 | 100.00 | 8 |
| 0 | 12 | 400.00 | 8 |
| 0 | 12 | 1000.0 | 8 |
| 0 | 12 | 2000.0 | 32 |
| 0 | 32 | 50.000 | 8 |
| 0 | 32 | 100.00 | 8 |
| 0 | 32 | 400.00 | 32 |
| 0 | 32 | 1000.0 | 32 |
| 0 | 32 | 2000.0 | 32 |
| 0 | 52 | 50.000 | 32 |
| 0 | 52 | 100.00 | 32 |
| 0 | 52 | 400.00 | 32 |
| 0 | 52 | 1000.0 | 32 |
| 0 | 52 | 2000.0 | 32 |
| 1 | 12 | 50.000 | 8 |
| 1 | 12 | 100.00 | 8 |
| 1 | 12 | 400.00 | 32 |
| 1 | 12 | 1000.0 | 32 |
| 1 | 12 | 2000.0 | 32 |
| 1 | 32 | 50.000 | 32 |
| 1 | 32 | 100.00 | 32 |
| 1 | 32 | 400.00 | 32 |
| 1 | 32 | 1000.0 | 32 |
| 1 | 32 | 2000.0 | 32 |
| 1 | 52 | 50.000 | 32 |
| 1 | 52 | 100.00 | 32 |
| 1 | 52 | 400.00 | 32 |
| 1 | 52 | 1000.0 | 32 |
| 1 | 52 | 2000.0 | 32 |
| 2 | 12 | 50.000 | 32 |
| 2 | 12 | 100.00 | 32 |
| 2 | 12 | 400.00 | 32 |
| 2 | 12 | 1000.0 | 32 |
| 2 | 12 | 2000.0 | 32 |
| 2 | 32 | 50.000 | 32 |
| 2 | 32 | 100.00 | 32 |
| 2 | 32 | 400.00 | 32 |
| 2 | 32 | 1000.0 | 32 |
| 2 | 32 | 2000.0 | 128 |
| 2 | 52 | 50.000 | 128 |
| 2 | 52 | 100.00 | 128 |
| 2 | 52 | 400.00 | 128 |
| 2 | 52 | 1000.0 | 128 |
| 2 | 52 | 2000.0 | 128 |

In the automatic acquisition mode, waveform acquisitions are made for each of three gain settings over each of a plurality of cable segment lengths as shown in FIG. 13. The segment lengths 1, 2 and 3 are defined by the delta. This may be understood by viewing Table 3. For a delta of 1 and a $V_P$ equal to 0.88, the segment length is the span in feet of the acquired waveform data, which is approximately 33 ft. Because of the requirement to overlap segment lengths in automatic acquisition mode as shown by the overlapped regions A and B in FIG. 13, the next contiguous segment length starts at approximately one-half of the first segments distance or at approximately 16.5 ft and extends to 67.6 ft., as indicated in Table 3 for a delta of 2. Gain segment acquisitions of waveform data 300, 302 and 304 for segment length 1; 306 308 and 310 for segment length 2; and 312, 314 and 316 for segment length 3 are made over the segment lengths until the end of the user defined span is reached as shown by dashed line 318. For example, if the user entered a span of 1000 ft., the optimum delta from Table 4 for the lowest gain setting (12 dB) and a distance of 1000 ft. is 8. From Table 3 for those values, the waveform segment span is approximately 271 ft. Waveform data acquisitions are made at this delta at the different gain settings. The next waveform segments is based on a delta of 16, with the new segment overlapping the first by a distance equal to one half the first segment length (i.e. approximately 135 ft.) and extending to approximately 541 ft. The next segment, based on a delta of 32 starts at approximately 271 ft and extends to approximately 1082 ft., which is past the span set by the user. Therefore under this example, there are three waveform segments.

Each acquired waveform segment at a particular gain setting within a segment is stored in a buffer and processed by the event marking algorithm previously described to detect and characterize events in the data. The event data for the acquired waveform data at each gain setting within a waveform segment is stored in an event table as described earlier. Congruent events in the event table are detected and filtered to produce a single event at a particular location as previously described and loaded into an overlapped event table. Congruent events in the overlapped event table, caused by the same event appearing in two different waveform segments, are filtered out to produce the mosaic event table containing those events that will be labeled on waveform display of data on display 38. One difference between the congruent event filter for the overlapped event table and the previously described congruent event filter is that the height of the events are compared in relation to the ERL. In this case, the overlapped events with the larger numerical value of ERL would be filtered out.

The events in the mosaic event table are examined to determine the largest RL event which is used to determine the optimum gain for a final waveform data acquisition over the previously selected span (one gain setting for an acquisition of 1000 ft.). The delta is determined for this gain setting and an acquisition is made. The acquired data is scaled to the display, which in the preferred embodiment has 634 horizontal pixels. A simple scaling factor is to use every fourth data of the 2500 data point array for display.

An apparatus has been described for acquiring waveform data from a metallic cable under test. The apparatus includes a transmitter for generating interrogating pulses for examining a segment or segment lengths of the transmission cable under test. In the preferred embodiment of the invention, the transmitter is a variable pulsewidth generator that generates pulses of varying width based on the segment length of the cable. In an automatic mode of operation, the pulsewidth of the interrogating pulses are automatically varied as a function of the segment length. A variable gain receiver receives a return signal from the segment or segment lengths of the cable and generates multiple gain segment acquisitions of waveform data representative of the signal from each segment or segment lengths with each gain segment acquisition of waveform data being generated with a different receiver gain. A controller operating under program control initiates the generation of interrogating pulses, establishes the receiver gain for each gain segment acquisition of waveform data, and controls the gain segment acquisitions of waveform data over the segment or segment lengths. An event table is created containing event characterization data for each gain segment. A congruent event filter passes events having optimum characterization data to a mosaic event table for display on a display device.

While the present invention has been described where the segment lengths are interrogated with a particular pulsewidth pulse, the invention can also be implemented where multiple pulsewidth interrogating pulses are generated for each variable gain segment acquisition of a segment length. This alternative approach takes into account the differing reflective characteristics of capacitive and inductive events as compared to resistive events. Depending on the pulsewidth of the interrogating, a capacitive or inductive event may not generate a return reflection. Using interrogating pulses with differing frequency content would tend to identify such capacitive and inductive events.

It will be obvious to those having skill in the art that many changes may be made to the details of the above-described embodiments of this invention without departing from the underlying principles thereof The scope of the present invention should, therefore, be determined only by the following claims.

APPENDIX A

TABLE 3

DATA POINTS PER PULSEWIDTH TABLE

Vp = 0.880000
Pulsewidth 0 = 4.00 nS
Pulsewidth 1 = 6.00 nS
Pulsewidth 2 = 25.00 nS
Number of acquisition points = 2500
Number of waveform points = 636

| DI | DT | 2500 Sp (ft) | PWN | Gain | Dist (ft) | EW (ft) | ActPts | | ExF | | ExPts | Xunits |
|---|---|---|---|---|---|---|---|---|---|---|---|---|
| 0 | 1 | 33.83 | 0 | 12 | 50.000 | 5.20 | 24.0 | * | 16.00 | = | 384 | 384 |
| 0 | 1 | 33.83 | 0 | 12 | 100.00 | 5.20 | 24.0 | * | 16.00 | = | 384 | 384 |
| 0 | 1 | 33.83 | 0 | 12 | 400.00 | 6.93 | 32.0 | * | 16.00 | = | 512 | 512 |
| 0 | 1 | 33.83 | 0 | 12 | 1000.0 | 6.93 | 32.0 | * | 16.00 | = | 512 | 512 |
| 0 | 1 | 33.83 | 0 | 12 | 2000.0 | 10.4 | 48.0 | * | 16.00 | = | 768 | 768 |
| 0 | 1 | 33.83 | 0 | 32 | 50.000 | 7.79 | 36.0 | * | 16.00 | = | 576 | 576 |
| 0 | 1 | 33.83 | 0 | 32 | 100.00 | 7.79 | 36.0 | * | 16.00 | = | 576 | 576 |
| 0 | 1 | 33.83 | 0 | 32 | 400.00 | 10.4 | 48.0 | * | 16.00 | = | 768 | 768 |
| 0 | 1 | 33.83 | 0 | 32 | 1000.0 | 10.4 | 48.0 | * | 16.00 | = | 768 | 768 |
| 0 | 1 | 33.83 | 0 | 32 | 2000.0 | 15.6 | 72.0 | * | 16.00 | = | 1152 | 1152 |
| 0 | 1 | 33.83 | 0 | 52 | 50.000 | 10.4 | 48.0 | * | 16.00 | = | 768 | 768 |
| 0 | 1 | 33.83 | 0 | 52 | 100.00 | 10.4 | 48.0 | * | 16.00 | = | 768 | 768 |
| 0 | 1 | 33.83 | 0 | 52 | 400.00 | 13.9 | 64.0 | * | 16.00 | = | 1024 | 1024 |
| 0 | 1 | 33.83 | 0 | 52 | 1000.0 | 13.9 | 64.0 | * | 16.00 | = | 1024 | 1024 |
| 0 | 1 | 33.83 | 0 | 52 | 2000.0 | 20.8 | 96.0 | * | 16.00 | = | 1536 | 1536 |
| 0 | 1 | 33.83 | 1 | 12 | 50.000 | 7.79 | 36.0 | * | 16.00 | = | 576 | 575 |
| 0 | 1 | 33.83 | 1 | 12 | 100.00 | 7.79 | 36.0 | * | 16.00 | = | 576 | 576 |
| 0 | 1 | 33.83 | 1 | 12 | 400.00 | 10.4 | 48.0 | * | 16.00 | = | 768 | 768 |
| 0 | 1 | 33.83 | 1 | 12 | 1000.0 | 10.4 | 48.0 | * | 16.00 | = | 768 | 768 |
| 0 | 1 | 33.83 | 1 | 12 | 2000.0 | 15.6 | 72.0 | * | 16.00 | = | 1152 | 1152 |
| 0 | 1 | 33.83 | 1 | 32 | 50.000 | 11.7 | 34.0 | * | 16.00 | = | 864 | 864 |
| 0 | 1 | 33.83 | 1 | 32 | 100.00 | 11.7 | 54.0 | * | 16.00 | = | 864 | 864 |
| 0 | 1 | 33.83 | 1 | 32 | 400.00 | 15.6 | 72.0 | * | 16.00 | = | 1152 | 1152 |
| 0 | 1 | 33.83 | 1 | 32 | 1000.0 | 15.6 | 72.0 | * | 16.00 | = | 1152 | 1152 |
| 0 | 1 | 33.83 | 1 | 32 | 2000.0 | 23.4 | 108.0 | * | 16.00 | = | 1728 | 1728 |
| 0 | 1 | 33.83 | 1 | 52 | 50.000 | 11.7 | 54.0 | * | 16.00 | = | 864 | 864 |
| 0 | 1 | 33.83 | 1 | 52 | 100.00 | 11.7 | 54.0 | * | 16.00 | = | 864 | 864 |
| 0 | 1 | 33.83 | 1 | 52 | 400.00 | 15.6 | 72.0 | * | 16.00 | = | 1152 | 1152 |
| 0 | 1 | 33.83 | 1 | 52 | 1000.0 | 15.6 | 72.0 | * | 15.00 | = | 1152 | 1152 |
| 0 | 1 | 33.83 | 1 | 52 | 2000.0 | 23.4 | 108.0 | * | 16.00 | = | 1728 | 1728 |
| 0 | 1 | 33.83 | 2 | 12 | 50.000 | 16.2 | 75.0 | * | 16.00 | = | 1200 | 1200 |
| 0 | 1 | 33.83 | 2 | 12 | 100.00 | 16.2 | 75.0 | * | 16.00 | = | 1200 | 1200 |
| 0 | 1 | 33.83 | 2 | 12 | 400.00 | 21.6 | 100.0 | * | 16.00 | = | 1600 | 1600 |
| 0 | 1 | 33.83 | 2 | 12 | 1000.0 | 21.6 | 100.0 | * | 16.00 | = | 1600 | 1600 |
| 0 | 1 | 33.83 | 2 | 12 | 2000.0 | 32.5 | 150.0 | * | 16.00 | = | 2400 | 2400 |
| 0 | 1 | 33.83 | 2 | 32 | 50.000 | 24.4 | 112.5 | * | 16.00 | = | 1792 | 1800 |
| 0 | 1 | 33.83 | 2 | 32 | 100.00 | 24.4 | 112.5 | * | 16.00 | = | 1792 | 1800 |
| 0 | 1 | 33.83 | 2 | 32 | 400.00 | 32.5 | 150.0 | * | 16.00 | = | 2400 | 2400 |
| 0 | 1 | 33.83 | 2 | 32 | 1000.0 | 32.5 | 150.0 | * | 16.00 | = | 2400 | 2400 |
| 0 | 1 | 33.83 | 2 | 32 | 2000.0 | 48.7 | 225.0 | * | 16.00 | = | 3600 | 3600 |
| 0 | 1 | 33.83 | 2 | 52 | 50.000 | 64.9 | 300.0 | * | 16.00 | = | 4800 | 4800 |
| 0 | 1 | 33.83 | 2 | 52 | 100.00 | 64.9 | 300.0 | * | 16.00 | = | 4800 | 4800 |
| 0 | 1 | 33.83 | 2 | 52 | 400.00 | 86.6 | 400.0 | * | 16.00 | = | 6400 | 6400 |
| 0 | 1 | 33.83 | 2 | 52 | 1000.0 | 86.6 | 400.0 | * | 16.00 | = | 6400 | 6400 |
| 0 | 1 | 33.83 | 2 | 52 | 2000.0 | 129.9 | 600.0 | * | 16.00 | = | 9600 | 9600 |

TABLE 3-continued

DATA POINTS PER PULSEWIDTH TABLE

| | | | | | | | | | | | | |
|---|---|---|---|---|---|---|---|---|---|---|---|---|
| 1 | 2 | 67.65 | 0 | 12 | 50.000 | 5.20 | 24.0 | * | 8.000 | = | 192 | 384 |
| 1 | 2 | 67.65 | 0 | 12 | 100.00 | 5.20 | 24.0 | * | 8.000 | = | 192 | 384 |
| 1 | 2 | 67.65 | 0 | 12 | 400.00 | 6.93 | 32.0 | * | 8.000 | = | 256 | 512 |
| 1 | 2 | 67.65 | 0 | 12 | 1000.0 | 6.93 | 32.0 | * | 8.000 | = | 256 | 512 |
| 1 | 2 | 67.65 | 0 | 12 | 2000.0 | 10.4 | 48.0 | * | 8.000 | = | 384 | 768 |
| 1 | 2 | 67.65 | 0 | 32 | 50.000 | 7.79 | 36.0 | * | 8.000 | = | 288 | 576 |
| 1 | 2 | 67.65 | 0 | 32 | 100.00 | 7.79 | 36.0 | * | 8.000 | = | 288 | 576 |
| 1 | 2 | 67.65 | 0 | 32 | 400.00 | 10.4 | 48.0 | * | 8.000 | = | 384 | 768 |
| 1 | 2 | 67.65 | 0 | 32 | 1000.0 | 10.4 | 48.0 | * | 8.000 | = | 384 | 768 |
| 1 | 2 | 67.65 | 0 | 32 | 2000.0 | 15.6 | 72.0 | * | 8.000 | = | 576 | 1152 |
| 1 | 2 | 67.65 | 0 | 52 | 50.000 | 10.4 | 48.0 | * | 8.000 | = | 384 | 768 |
| 1 | 2 | 67.65 | 0 | 52 | 100.00 | 10.4 | 48.0 | * | 8.000 | = | 384 | 768 |
| 1 | 2 | 67.65 | 0 | 52 | 400.00 | 13.9 | 64.0 | * | 8.000 | = | 512 | 1024 |
| 1 | 2 | 67.65 | 0 | 52 | 1000.0 | 13.9 | 64.0 | * | 8.000 | = | 512 | 1024 |
| 1 | 2 | 67.65 | 0 | 52 | 2000.0 | 20.8 | 96.0 | * | 8.000 | = | 768 | 1536 |
| 1 | 2 | 67.65 | 1 | 12 | 50.000 | 7.79 | 36.0 | * | 8.000 | = | 288 | 576 |
| 1 | 2 | 67.65 | 1 | 12 | 100.00 | 7.79 | 36.0 | * | 8.000 | = | 288 | 576 |
| 1 | 2 | 67.65 | 1 | 12 | 400.00 | 10.4 | 48.0 | * | 8.000 | = | 384 | 768 |
| 1 | 2 | 67.65 | 1 | 12 | 1000.0 | 10.4 | 48.0 | * | 8.000 | = | 384 | 768 |
| 1 | 2 | 67.65 | 1 | 12 | 2000.0 | 15.6 | 72.0 | * | 8.000 | = | 576 | 1152 |
| 1 | 2 | 67.65 | 1 | 32 | 50.000 | 11.7 | 54.0 | * | 8.000 | = | 432 | 864 |
| 1 | 2 | 67.65 | 1 | 32 | 100.00 | 11.7 | 54.0 | * | 8.000 | = | 432 | 864 |
| 1 | 2 | 67.65 | 1 | 32 | 400.00 | 15.6 | 72.0 | * | 8.000 | = | 576 | 1152 |
| 1 | 2 | 67.65 | 1 | 32 | 1000.0 | 15.6 | 72.0 | * | 8.000 | = | 576 | 1152 |
| 1 | 2 | 67.65 | 1 | 32 | 2000.0 | 23.4 | 108.0 | * | 8.000 | = | 864 | 1728 |
| 1 | 2 | 67.65 | 1 | 52 | 50.000 | 11.7 | 54.0 | * | 8.000 | = | 432 | 864 |
| 1 | 2 | 67.65 | 1 | 52 | 100.00 | 11.7 | 54.0 | * | 8.000 | = | 432 | 864 |
| 1 | 2 | 67.65 | 1 | 52 | 400.00 | 15.6 | 72.0 | * | 8.000 | = | 576 | 1152 |
| 1 | 2 | 67.65 | 1 | 52 | 1000.0 | 15.6 | 72.0 | * | 8.000 | = | 576 | 1152 |
| 1 | 2 | 67.65 | 1 | 52 | 2000.0 | 23.4 | 108.0 | * | 8.000 | = | 864 | 1728 |
| 1 | 2 | 67.65 | 2 | 12 | 50.000 | 16.2 | 75.0 | * | 8.000 | = | 600 | 1200 |
| 1 | 2 | 67.65 | 2 | 12 | 100.00 | 16.2 | 75.0 | * | 8.000 | = | 600 | 1200 |
| 1 | 2 | 67.65 | 2 | 12 | 400.00 | 21.6 | 100.0 | * | 8.000 | = | 800 | 1600 |
| 1 | 2 | 67.65 | 2 | 12 | 1000.0 | 21.6 | 100.0 | * | 8.000 | = | 800 | 1600 |
| 1 | 2 | 67.65 | 2 | 12 | 2000.0 | 32.5 | 150.0 | * | 8.000 | = | 1200 | 2400 |
| 1 | 2 | 67.65 | 2 | 32 | 50.000 | 24.4 | 112.5 | * | 8.000 | = | 896 | 1800 |
| 1 | 2 | 67.65 | 2 | 32 | 100.00 | 24.4 | 112.5 | * | 8.000 | = | 896 | 1800 |
| 1 | 2 | 67.65 | 2 | 32 | 400.00 | 32.5 | 150.0 | * | 8.000 | = | 1200 | 2400 |
| 1 | 2 | 67.65 | 2 | 32 | 1000.0 | 32.5 | 150.0 | * | 8.000 | = | 1200 | 2400 |
| 1 | 2 | 67.65 | 2 | 32 | 2000.0 | 48.7 | 225.0 | * | 8.000 | = | 1800 | 3600 |
| 1 | 2 | 67.65 | 2 | 52 | 50.000 | 64.9 | 300.0 | * | 8.000 | = | 2400 | 4800 |
| 1 | 2 | 67.65 | 2 | 52 | 100.00 | 64.9 | 300.0 | * | 8.000 | = | 2400 | 4800 |
| 1 | 2 | 67.65 | 2 | 52 | 400.00 | 86.6 | 400.0 | * | 8.000 | = | 3200 | 6400 |
| 1 | 2 | 67.65 | 2 | 52 | 1000.0 | 86.6 | 400.0 | * | 8.000 | = | 3200 | 6400 |
| 1 | 2 | 67.65 | 2 | 52 | 2000.0 | 129.9 | 600.0 | * | 8.000 | = | 4800 | 9600 |
| 2 | 4 | 135.3 | 0 | 12 | 50.000 | 5.20 | 24.0 | * | 4.000 | = | 96 | 384 |
| 2 | 4 | 135.3 | 0 | 12 | 100.00 | 5.20 | 24.0 | * | 4.000 | = | 96 | 384 |
| 2 | 4 | 135.3 | 0 | 12 | 400.00 | 6.93 | 32.0 | * | 4.000 | = | 128 | 512 |
| 2 | 4 | 135.3 | 0 | 12 | 1000.0 | 6.93 | 32.0 | * | 4.000 | = | 128 | 512 |
| 2 | 4 | 135.3 | 0 | 12 | 2000.0 | 10.4 | 48.0 | * | 4.000 | = | 192 | 768 |
| 2 | 4 | 135.3 | 0 | 32 | 50.000 | 7.79 | 36.0 | * | 4.000 | = | 144 | 576 |
| 2 | 4 | 135.3 | 0 | 32 | 100.00 | 7.79 | 36.0 | * | 4.000 | = | 144 | 576 |
| 2 | 4 | 135.3 | 0 | 32 | 400.00 | 10.4 | 48.0 | * | 4.000 | = | 192 | 768 |
| 2 | 4 | 135.3 | 0 | 32 | 1000.0 | 10.4 | 48.0 | * | 4.000 | = | 192 | 768 |
| 2 | 4 | 135.3 | 0 | 32 | 2000.0 | 15.6 | 72.0 | * | 4.000 | = | 288 | 1152 |
| 2 | 4 | 135.3 | 0 | 52 | 50.000 | 10.4 | 48.0 | * | 4.000 | = | 192 | 768 |
| 2 | 4 | 135.3 | 0 | 52 | 100.00 | 10.4 | 48.0 | * | 4.000 | = | 192 | 768 |
| 2 | 4 | 135.3 | 0 | 52 | 400.00 | 13.9 | 64.0 | * | 4.000 | = | 256 | 1024 |
| 2 | 4 | 135.3 | 0 | 52 | 1000.0 | 13.9 | 64.0 | * | 4.000 | = | 256 | 1024 |
| 2 | 4 | 135.3 | 0 | 52 | 2000.0 | 20.8 | 96.0 | * | 4.000 | = | 384 | 1536 |
| 2 | 4 | 135.3 | 1 | 12 | 50.000 | 7.79 | 36.0 | * | 4.000 | = | 144 | 576 |
| 2 | 4 | 135.3 | 1 | 12 | 100.00 | 7.79 | 36.0 | * | 4.000 | = | 144 | 576 |
| 2 | 4 | 135.3 | 1 | 12 | 400.00 | 10.4 | 48.0 | * | 4.000 | = | 192 | 768 |
| 2 | 4 | 135.3 | 1 | 12 | 1000.0 | 10.4 | 48.0 | * | 4.000 | = | 192 | 768 |
| 2 | 4 | 135.3 | 1 | 12 | 2000.0 | 15.6 | 72.0 | * | 4.000 | = | 288 | 1152 |
| 2 | 4 | 135.3 | 1 | 32 | 50.000 | 11.7 | 54.0 | * | 4.000 | = | 216 | 864 |
| 2 | 4 | 135.3 | 1 | 32 | 100.00 | 11.7 | 54.0 | * | 4.000 | = | 216 | 864 |
| 2 | 4 | 135.3 | 1 | 32 | 400.00 | 15.6 | 72.0 | * | 4.000 | = | 288 | 1152 |
| 2 | 4 | 135.3 | 1 | 32 | 1000.0 | 15.6 | 72.0 | * | 4.000 | = | 288 | 1152 |
| 2 | 4 | 135.3 | 1 | 32 | 2000.0 | 23.4 | 108.0 | * | 4.000 | = | 432 | 1728 |
| 2 | 4 | 135.3 | 1 | 52 | 50.000 | 11.7 | 54.0 | * | 4.000 | = | 216 | 864 |
| 2 | 4 | 135.3 | 1 | 52 | 100.00 | 11.7 | 54.0 | * | 4.000 | = | 216 | 864 |
| 2 | 4 | 135.3 | 1 | 52 | 400.00 | 15.6 | 72.0 | * | 4.000 | = | 288 | 1152 |
| 2 | 4 | 135.3 | 1 | 52 | 1000.0 | 15.6 | 72.0 | * | 4.000 | = | 288 | 1152 |
| 2 | 4 | 135.3 | 1 | 52 | 2000.0 | 23.4 | 108.0 | * | 4.000 | = | 432 | 1728 |
| 2 | 4 | 135.3 | 2 | 12 | 50.000 | 16.2 | 75.0 | * | 4.000 | = | 300 | 1200 |
| 2 | 4 | 135.3 | 2 | 12 | 100.00 | 16.2 | 75.0 | * | 4.000 | = | 300 | 1200 |

TABLE 3-continued

DATA POINTS PER PULSEWIDTH TABLE

| | | | | | | | | | | | | |
|---|---|---|---|---|---|---|---|---|---|---|---|---|
| 2 | 4 | 135.3 | 2 | 12 | 400.00 | 21.6 | 100.0 | * | 4.000 | = | 400 | 1600 |
| 2 | 4 | 135.3 | 2 | 12 | 1000.0 | 21.6 | 100.0 | * | 4.000 | = | 400 | 1500 |
| 2 | 4 | 135.3 | 2 | 12 | 2000.0 | 32.5 | 150.0 | * | 4.000 | = | 600 | 2400 |
| 2 | 4 | 135.3 | 2 | 32 | 50.000 | 24.4 | 112.5 | * | 4.000 | = | 448 | 1800 |
| 2 | 4 | 135.3 | 2 | 32 | 100.00 | 24.4 | 112.5 | * | 4.000 | = | 448 | 1800 |
| 2 | 4 | 135.3 | 2 | 32 | 400.00 | 32.5 | 150.0 | * | 4.000 | = | 600 | 2400 |
| 2 | 4 | 135.3 | 2 | 32 | 1000.0 | 32.5 | 150.0 | * | 4.000 | = | 600 | 2400 |
| 2 | 4 | 135.3 | 2 | 32 | 2000.0 | 48.7 | 225.0 | * | 4.000 | = | 900 | 3600 |
| 2 | 4 | 135.3 | 2 | 52 | 50.000 | 64.9 | 300.0 | * | 4.000 | = | 1200 | 4800 |
| 2 | 4 | 135.3 | 2 | 52 | 100.00 | 64.9 | 300.0 | * | 4.000 | = | 1200 | 4800 |
| 2 | 4 | 135.3 | 2 | 52 | 400.00 | 86.6 | 400.0 | * | 4.000 | = | 1600 | 6400 |
| 2 | 4 | 135.3 | 2 | 52 | 1000.0 | 86.6 | 400.0 | * | 4.000 | = | 1600 | 6400 |
| 2 | 4 | 135.3 | 2 | 52 | 2000.0 | 129.9 | 600.0 | * | 4.000 | = | 2400 | 9600 |
| 3 | 8 | 270.6 | 0 | 12 | 50.000 | 5.20 | 24.0 | * | 2.000 | = | 48 | 384 |
| 3 | 8 | 270.6 | 0 | 12 | 100.00 | 5.20 | 24.0 | * | 2.000 | = | 48 | 384 |
| 3 | 8 | 270.6 | 0 | 12 | 400.00 | 6.93 | 32.0 | * | 2.000 | = | 64 | 512 |
| 3 | 8 | 270.6 | 0 | 12 | 1000.0 | 6.93 | 32.0 | * | 2.000 | = | 64 | 512 |
| 3 | 8 | 270.6 | 0 | 12 | 2000.0 | 10.4 | 48.0 | * | 2.000 | = | 96 | 768 |
| 3 | 8 | 270.6 | 0 | 32 | 50.000 | 7.79 | 36.0 | * | 2.000 | = | 72 | 576 |
| 3 | 8 | 270.6 | 0 | 32 | 100.00 | 7.79 | 36.0 | * | 2.000 | = | 72 | 576 |
| 3 | 8 | 270.6 | 0 | 32 | 400.00 | 10.4 | 48.0 | * | 2.000 | = | 96 | 768 |
| 3 | 8 | 270.6 | 0 | 32 | 1000.0 | 10.4 | 48.0 | * | 2.000 | = | 96 | 768 |
| 3 | 8 | 270.6 | 0 | 32 | 2000.0 | 15.6 | 72.0 | * | 2.000 | = | 144 | 1152 |
| 3 | 8 | 270.6 | 0 | 52 | 50.000 | 10.4 | 48.0 | * | 2.000 | = | 96 | 768 |
| 3 | 8 | 270.6 | 0 | 52 | 100.00 | 10.4 | 48.0 | * | 2.000 | = | 96 | 768 |
| 3 | 8 | 270.6 | 0 | 52 | 400.00 | 13.9 | 64.0 | * | 2.000 | = | 128 | 1024 |
| 3 | 8 | 270.6 | 0 | 52 | 1000.0 | 13.9 | 64.0 | * | 2.000 | = | 128 | 1024 |
| 3 | 8 | 270.6 | 0 | 52 | 2000.0 | 20.8 | 96.0 | * | 2.000 | = | 192 | 1536 |
| 3 | 8 | 270.6 | 1 | 12 | 50.000 | 7.79 | 36.0 | * | 2.000 | = | 72 | 576 |
| 3 | 8 | 270.6 | 1 | 12 | 100.00 | 7.79 | 36.0 | * | 2.000 | = | 72 | 576 |
| 3 | 8 | 270.6 | 1 | 12 | 400.00 | 10.4 | 48.0 | * | 2.000 | = | 96 | 768 |
| 3 | 8 | 270.6 | 1 | 12 | 1000.0 | 10.4 | 48.0 | * | 2.000 | = | 96 | 768 |
| 3 | 8 | 270.6 | 1 | 12 | 2000.0 | 15.6 | 72.0 | * | 2.000 | = | 144 | 1152 |
| 3 | 8 | 270.6 | 1 | 32 | 50.000 | 11.7 | 54.0 | * | 2.000 | = | 108 | 864 |
| 3 | 8 | 270.6 | 1 | 32 | 100.00 | 11.7 | 54.0 | * | 2.000 | = | 108 | 864 |
| 3 | 8 | 270.6 | 1 | 32 | 400.00 | 15.6 | 72.0 | * | 2.000 | = | 144 | 1152 |
| 3 | 8 | 270.6 | 1 | 32 | 1000.0 | 15.6 | 72.0 | * | 2.000 | = | 144 | 1152 |
| 3 | 8 | 270.6 | 1 | 32 | 2000.0 | 23.4 | 108.0 | * | 2.000 | = | 216 | 1728 |
| 3 | 8 | 270.6 | 1 | 52 | 50.000 | 11.7 | 54.0 | * | 2.000 | = | 108 | 864 |
| 3 | 8 | 270.6 | 1 | 52 | 100.00 | 11.7 | 54.0 | * | 2.000 | = | 108 | 864 |
| 3 | 8 | 270.6 | 1 | 52 | 400.00 | 15.6 | 72.0 | * | 2.000 | = | 144 | 1152 |
| 3 | 8 | 270.6 | 1 | 52 | 1000.0 | 15.6 | 72.0 | * | 2.000 | = | 144 | 1152 |
| 3 | 8 | 270.6 | 1 | 52 | 2000.0 | 23.4 | 108.0 | * | 2.000 | = | 216 | 1728 |
| 3 | 8 | 270.6 | 2 | 12 | 50.000 | 16.2 | 75.0 | * | 2.000 | = | 150 | 1200 |
| 3 | 8 | 270.6 | 2 | 12 | 100.00 | 16.2 | 75.0 | * | 2.000 | = | 150 | 1200 |
| 3 | 8 | 270.6 | 2 | 12 | 400.00 | 21.6 | 100.0 | * | 2.000 | = | 200 | 1600 |
| 3 | 8 | 270.6 | 2 | 12 | 1000.0 | 21.6 | 100.0 | * | 2.000 | = | 200 | 1600 |
| 3 | 8 | 270.6 | 2 | 12 | 2000.0 | 32.5 | 150.0 | * | 2.000 | = | 300 | 2400 |
| 3 | 8 | 270.6 | 2 | 32 | 50.000 | 24.4 | 112.5 | * | 2.000 | = | 224 | 1800 |
| 3 | 8 | 270.6 | 2 | 32 | 100.00 | 24.4 | 112.5 | * | 2.000 | = | 224 | 1800 |
| 3 | 8 | 270.6 | 2 | 32 | 400.00 | 32.5 | 150.0 | * | 2.000 | = | 300 | 2400 |
| 3 | 8 | 270.6 | 2 | 32 | 1000.0 | 32.5 | 150.0 | * | 2.000 | = | 300 | 2400 |
| 3 | 8 | 270.6 | 2 | 32 | 2000.0 | 48.7 | 225.0 | * | 2.000 | = | 450 | 3600 |
| 3 | 8 | 270.6 | 2 | 52 | 50.000 | 64.9 | 300.0 | * | 2.000 | = | 600 | 4800 |
| 3 | 8 | 270.6 | 2 | 52 | 100.00 | 64.9 | 300.0 | * | 2.000 | = | 600 | 4800 |
| 3 | 8 | 270.6 | 2 | 52 | 400.00 | 86.6 | 400.0 | * | 2.000 | = | 800 | 6400 |
| 3 | 8 | 270.6 | 2 | 52 | 1000.0 | 86.6 | 400.0 | * | 2.000 | = | 800 | 6400 |
| 3 | 8 | 270.6 | 2 | 52 | 2000.0 | 129.9 | 600.0 | * | 2.000 | = | 1200 | 9600 |
| 4 | 16 | 541.2 | 0 | 12 | 50.000 | 5.20 | 24.0 | * | 1.000 | = | 24 | 384 |
| 4 | 16 | 541.2 | 0 | 12 | 100.00 | 5.20 | 24.0 | * | 1.000 | = | 24 | 384 |
| 4 | 16 | 541.2 | 0 | 12 | 400.00 | 6.93 | 32.0 | * | 1.000 | = | 32 | 512 |
| 4 | 16 | 541.2 | 0 | 12 | 1000.0 | 6.93 | 32.0 | * | 1.000 | = | 32 | 512 |
| 4 | 16 | 541.2 | 0 | 12 | 2000.0 | 10.4 | 48.0 | * | 1.000 | = | 48 | 768 |
| 4 | 16 | 541.2 | 0 | 32 | 50.000 | 7.79 | 36.0 | * | 1.000 | = | 36 | 576 |
| 4 | 16 | 541.2 | 0 | 32 | 100.00 | 7.79 | 36.0 | * | 1.000 | = | 36 | 576 |
| 4 | 16 | 541.2 | 0 | 32 | 400.00 | 10.4 | 48.0 | * | 1.000 | = | 48 | 768 |
| 4 | 16 | 541.2 | 0 | 32 | 1000.0 | 10.4 | 48.0 | * | 1.000 | = | 48 | 768 |
| 4 | 16 | 541.2 | 0 | 32 | 2000.0 | 15.6 | 72.0 | * | 1.000 | = | 72 | 1152 |
| 4 | 16 | 541.2 | 0 | 52 | 50.000 | 10.4 | 48.0 | * | 1.000 | = | 48 | 768 |
| 4 | 16 | 541.2 | 0 | 52 | 100.00 | 10.4 | 48.0 | * | 1.000 | = | 48 | 768 |
| 4 | 16 | 541.2 | 0 | 52 | 400.00 | 13.9 | 64.0 | * | 1.000 | = | 64 | 1024 |
| 4 | 16 | 541.2 | 0 | 52 | 1000.0 | 13.9 | 64.0 | * | 1.000 | = | 64 | 1024 |
| 4 | 16 | 541.2 | 0 | 52 | 2000.0 | 20.8 | 96.0 | * | 1.000 | = | 96 | 1536 |
| 4 | 16 | 541.2 | 1 | 12 | 50.000 | 7.79 | 36.0 | * | 1.006 | = | 36 | 576 |
| 4 | 16 | 541.2 | 1 | 12 | 100.00 | 7.79 | 36.0 | * | 1.000 | = | 36 | 576 |
| 4 | 16 | 541.2 | 1 | 12 | 400.00 | 10.4 | 48.0 | * | 1.000 | = | 48 | 768 |
| 4 | 16 | 541.2 | 1 | 12 | 1000.0 | 10.4 | 48.0 | * | 1.000 | = | 48 | 768 |

TABLE 3-continued

DATA POINTS PER PULSEWIDTH TABLE

| | | | | | | | | | | | | |
|---|---|---|---|---|---|---|---|---|---|---|---|---|
| 4 | 16 | 541.2 | 1 | 12 | 2000.0 | 15.6 | 72.0 | * | 1.000 | = | 72 | 1152 |
| 4 | 16 | 541.2 | 1 | 32 | 50.000 | 11.7 | 54.0 | * | 1.000 | = | 54 | 864 |
| 4 | 16 | 541.2 | 1 | 32 | 100.00 | 11.7 | 54.0 | * | 1.000 | = | 54 | 864 |
| 4 | 16 | 541.2 | 1 | 32 | 400.00 | 15.6 | 72.0 | * | 1.000 | = | 72 | 1152 |
| 4 | 16 | 541.2 | 1 | 32 | 1000.0 | 15.6 | 72.0 | * | 1.000 | = | 72 | 1152 |
| 4 | 16 | 541.2 | 1 | 32 | 2000.0 | 23.4 | 108.0 | * | 1.000 | = | 108 | 1728 |
| 4 | 16 | 541.2 | 1 | 52 | 50.000 | 11.7 | 54.0 | * | 1.000 | = | 54 | 864 |
| 4 | 16 | 541.2 | 1 | 52 | 100.00 | 11.7 | 54.0 | * | 1.000 | = | 54 | 864 |
| 4 | 16 | 541.2 | 1 | 52 | 400.00 | 15.6 | 72.0 | * | 1.000 | = | 72 | 1152 |
| 4 | 16 | 541.2 | 1 | 52 | 1000.0 | 15.6 | 72.0 | * | 1.000 | = | 72 | 1152 |
| 4 | 16 | 541.2 | 1 | 52 | 2000.0 | 23.4 | 108.0 | * | 1.000 | = | 108 | 1728 |
| 4 | 16 | 541.2 | 2 | 12 | 50.000 | 16.2 | 75.0 | * | 1.000 | = | 75 | 1200 |
| 4 | 16 | 541.2 | 2 | 12 | 100.00 | 16.2 | 75.0 | * | 1.000 | = | 75 | 1200 |
| 4 | 16 | 541.2 | 2 | 12 | 400.00 | 21.6 | 100.0 | * | 1.000 | = | 100 | 1600 |
| 4 | 16 | 541.2 | 2 | 12 | 1000.0 | 21.6 | 100.0 | * | 1.000 | = | 100 | 1600 |
| 4 | 16 | 541.2 | 2 | 12 | 2000.0 | 32.5 | 150.0 | * | 1.000 | = | 150 | 2400 |
| 4 | 16 | 541.2 | 2 | 32 | 50.000 | 24.4 | 112.5 | * | 1.000 | = | 112 | 1800 |
| 4 | 16 | 541.2 | 2 | 32 | 100.00 | 24.4 | 112.5 | * | 1.000 | = | 112 | 1800 |
| 4 | 16 | 541.2 | 2 | 32 | 400.00 | 32.5 | 150.0 | * | 1.000 | = | 150 | 2400 |
| 4 | 16 | 541.2 | 2 | 32 | 1000.0 | 32.5 | 150.0 | * | 1.000 | = | 150 | 2400 |
| 4 | 16 | 541.2 | 2 | 32 | 2000.0 | 48.7 | 225.0 | * | 1.000 | = | 225 | 3600 |
| 4 | 16 | 541.2 | 2 | 52 | 50.000 | 64.9 | 300.0 | * | 1.000 | = | 300 | 4800 |
| 4 | 16 | 541.2 | 2 | 52 | 100.00 | 64.9 | 300.0 | * | 1.000 | = | 300 | 4800 |
| 4 | 16 | 541.2 | 2 | 52 | 400.00 | 86.6 | 400.0 | * | 1.000 | = | 400 | 6400 |
| 4 | 16 | 541.2 | 2 | 52 | 1000.0 | 86.6 | 400.0 | * | 1.000 | = | 400 | 6400 |
| 4 | 16 | 541.2 | 2 | 52 | 2000.0 | 129.9 | 600.0 | * | 1.000 | = | 600 | 9600 |
| 5 | 32 | 1082.4 | 0 | 12 | 50.000 | 5.20 | 12.0 | * | 1.000 | = | 12 | 384 |
| 5 | 32 | 1082.4 | 0 | 12 | 100.00 | 5.20 | 12.0 | * | 1.000 | = | 12 | 384 |
| 5 | 32 | 1082.4 | 0 | 12 | 400.00 | 6.93 | 16.0 | * | 1.000 | = | 16 | 512 |
| 5 | 32 | 1082.4 | 0 | 12 | 1000.0 | 6.93 | 16.0 | * | 1.000 | = | 16 | 512 |
| 5 | 32 | 1082.4 | 0 | 12 | 2000.0 | 10.4 | 24.0 | * | 1.000 | = | 24 | 768 |
| 5 | 32 | 1082.4 | 0 | 32 | 50.000 | 7.79 | 18.0 | * | 1.000 | = | 18 | 576 |
| 5 | 32 | 1082.4 | 0 | 32 | 100.00 | 7.79 | 18.0 | * | 1.000 | = | 18 | 576 |
| 5 | 32 | 1082.4 | 0 | 32 | 400.00 | 10.4 | 24.0 | * | 1.000 | = | 24 | 768 |
| 5 | 32 | 1082.4 | 0 | 32 | 1000.0 | 10.4 | 24.0 | * | 1.000 | = | 24 | 768 |
| 5 | 32 | 1082.4 | 0 | 32 | 2000.0 | 15.6 | 36.0 | * | 1.000 | = | 36 | 1152 |
| 5 | 32 | 1082.4 | 0 | 52 | 50.000 | 10.4 | 24.0 | * | 1.000 | = | 24 | 768 |
| 5 | 32 | 1082.4 | 0 | 52 | 100.00 | 10.4 | 24.0 | * | 1.000 | = | 24 | 768 |
| 5 | 32 | 1082.4 | 0 | 52 | 400.00 | 13.9 | 32.0 | * | 1.000 | = | 32 | 1024 |
| 5 | 32 | 1082.4 | 0 | 52 | 1000.0 | 13.9 | 32.0 | * | 1.000 | = | 32 | 1024 |
| 5 | 32 | 1082.4 | 0 | 52 | 2000.0 | 20.8 | 48.0 | * | 1.000 | = | 48 | 1536 |
| 5 | 32 | 1082.4 | 1 | 12 | 50.000 | 7.79 | 18.0 | * | 1.000 | = | 18 | 576 |
| 5 | 32 | 1082.4 | 1 | 12 | 100.00 | 7.79 | 18.0 | * | 1.000 | = | 18 | 576 |
| 5 | 32 | 1082.4 | 1 | 12 | 400.00 | 10.4 | 24.0 | * | 1.000 | = | 24 | 768 |
| 5 | 32 | 1082.4 | 1 | 12 | 1000.0 | 10.4 | 24.0 | * | 1.000 | = | 24 | 768 |
| 5 | 32 | 1082.4 | 1 | 12 | 2000.0 | 15.6 | 36.0 | * | 1.000 | = | 36 | 1152 |
| 5 | 32 | 1082.4 | 1 | 32 | 50.000 | 11.7 | 27.0 | * | 1.000 | = | 27 | 864 |
| 5 | 32 | 1082.4 | 1 | 32 | 100.00 | 11.7 | 27.0 | * | 1.000 | = | 27 | 864 |
| 5 | 32 | 1082.4 | 1 | 32 | 400.00 | 15.6 | 36.0 | * | 1.000 | = | 36 | 1152 |
| 5 | 32 | 1082.4 | 1 | 32 | 1000.0 | 15.6 | 36.0 | * | 1.000 | = | 36 | 1152 |
| 5 | 32 | 1082.4 | 1 | 32 | 2000.0 | 23.4 | 54.0 | * | 1.000 | = | 54 | 1728 |
| 5 | 32 | 1082.4 | 1 | 52 | 50.000 | 11.7 | 27.0 | * | 1.000 | = | 27 | 864 |
| 5 | 32 | 1082.4 | 1 | 52 | 100.00 | 11.7 | 27.0 | * | 1.000 | = | 27 | 864 |
| 5 | 32 | 1082.4 | 1 | 52 | 400.00 | 15.6 | 36.0 | * | 1.000 | = | 36 | 1152 |
| 5 | 32 | 1082.4 | 1 | 52 | 1000.0 | 15.6 | 36.0 | * | 1.000 | = | 36 | 1152 |
| 5 | 32 | 1082.4 | 1 | 52 | 2000.0 | 23.4 | 54.0 | * | 1.000 | = | 54 | 1728 |
| 5 | 32 | 1082.4 | 2 | 12 | 50.000 | 16.2 | 37.5 | * | 1.000 | = | 37 | 1200 |
| 5 | 32 | 1082.4 | 2 | 12 | 100.00 | 16.2 | 37.5 | * | 1.000 | = | 37 | 1200 |
| 5 | 32 | 1082.4 | 2 | 12 | 400.00 | 21.6 | 50.0 | * | 1.000 | = | 50 | 1600 |
| 5 | 32 | 1082.4 | 2 | 12 | 1000.0 | 21.6 | 50.0 | * | 1.000 | = | 50 | 1600 |
| 5 | 32 | 1082.4 | 2 | 12 | 2000.0 | 32.5 | 75.0 | * | 1.000 | = | 75 | 2400 |
| 5 | 32 | 1082.4 | 2 | 32 | 50.000 | 24.4 | 56.3 | * | 1.000 | = | 56 | 1800 |
| 5 | 32 | 1082.4 | 2 | 32 | 100.00 | 24.4 | 56.3 | * | 1.000 | = | 56 | 1800 |
| 5 | 32 | 1082.4 | 2 | 32 | 400.00 | 32.5 | 75.0 | * | 1.000 | = | 75 | 2400 |
| 5 | 32 | 1082.4 | 2 | 32 | 1000.0 | 32.5 | 75.0 | * | 1.000 | = | 75 | 2400 |
| 5 | 32 | 1082.4 | 2 | 32 | 2000.0 | 48.7 | 112.5 | * | 1.000 | = | 112 | 3600 |
| 5 | 32 | 1082.4 | 2 | 52 | 50.000 | 64.9 | 150.0 | * | 1.000 | = | 150 | 4800 |
| 5 | 32 | 1082.4 | 2 | 52 | 100.00 | 64.9 | 150.0 | * | 1.000 | = | 150 | 4800 |
| 5 | 32 | 1082.4 | 2 | 52 | 400.00 | 86.6 | 200.0 | * | 1.000 | = | 200 | 6400 |
| 5 | 32 | 1082.4 | 2 | 52 | 1000.0 | 86.6 | 200.0 | * | 1.000 | = | 200 | 6400 |
| 5 | 32 | 1082.4 | 2 | 52 | 2000.0 | 129.9 | 300.0 | * | 1.000 | = | 300 | 9600 |
| 6 | 64 | 2164.8 | 0 | 12 | 50.000 | 5.20 | 6.00 | * | 1.000 | = | 6 | 384 |
| 6 | 64 | 2164.8 | 0 | 12 | 100.00 | 5.20 | 6.00 | * | 1.000 | = | 6 | 384 |
| 6 | 64 | 2164.8 | 0 | 12 | 400.00 | 6.93 | 8.00 | * | 1.000 | = | 8 | 512 |
| 6 | 64 | 2164.8 | 0 | 12 | 1000.0 | 6.93 | 8.00 | * | 1.000 | = | 8 | 512 |
| 6 | 64 | 2164.8 | 0 | 12 | 2000.0 | 10.4 | 12.0 | * | 1.000 | = | 12 | 768 |
| 6 | 64 | 2164.8 | 0 | 32 | 50.000 | 7.79 | 9.00 | * | 1.000 | = | 9 | 576 |

TABLE 3-continued

DATA POINTS PER PULSEWIDTH TABLE

| | | | | | | | | | | | | |
|---|---|---|---|---|---|---|---|---|---|---|---|---|
| 6 | 64 | 2164.8 | 0 | 32 | 100.00 | 7.79 | 9.00 | * | 1.000 | = | 9 | 576 |
| 6 | 64 | 2164.8 | 0 | 32 | 400.00 | 10.4 | 12.0 | * | 1.000 | = | 12 | 768 |
| 6 | 64 | 2164.8 | 0 | 32 | 1000.0 | 10.4 | 12.0 | * | 1.000 | = | 12 | 768 |
| 6 | 64 | 2164.8 | 0 | 32 | 2000.0 | 15.6 | 18.0 | * | 1.000 | = | 18 | 1152 |
| 6 | 64 | 2164.8 | 0 | 52 | 50.000 | 10.4 | 12.0 | * | 1.000 | = | 12 | 768 |
| 6 | 64 | 2164.8 | 0 | 52 | 100.00 | 10.4 | 12.0 | * | 1.000 | = | 12 | 768 |
| 6 | 64 | 2164.8 | 0 | 52 | 400.00 | 13.9 | 16.0 | * | 1.000 | = | 16 | 1024 |
| 6 | 64 | 2164.8 | 0 | 52 | 1000.0 | 13.9 | 16.0 | * | 1.000 | = | 16 | 1024 |
| 6 | 64 | 2164.8 | 0 | 52 | 2000.0 | 20.8 | 24.0 | * | 1.000 | = | 24 | 1536 |
| 6 | 64 | 2164.8 | 1 | 12 | 50.000 | 7.79 | 9.00 | * | 1.000 | = | 9 | 576 |
| 6 | 64 | 2164.8 | 1 | 12 | 100.00 | 7.79 | 9.00 | * | 1.000 | = | 9 | 576 |
| 6 | 64 | 2164.8 | 1 | 12 | 400.00 | 10.4 | 12.0 | * | 1.000 | = | 12 | 768 |
| 6 | 64 | 2164.8 | 1 | 12 | 1000.0 | 10.4 | 12.0 | * | 1.000 | = | 12 | 768 |
| 6 | 64 | 2164.8 | 1 | 12 | 2000.0 | 15.6 | 18.0 | * | 1.000 | = | 18 | 1152 |
| 6 | 64 | 2164.8 | 1 | 32 | 50.000 | 11.7 | 13.5 | * | 1.000 | = | 13 | 864 |
| 6 | 64 | 2164.8 | 1 | 32 | 100.00 | 11.7 | 13.5 | * | 1.000 | = | 13 | 864 |
| 6 | 64 | 2164.8 | 1 | 32 | 400.00 | 15.6 | 18.0 | * | 1.000 | = | 18 | 1152 |
| 6 | 64 | 2164.8 | 1 | 32 | 1000.0 | 15.6 | 18.0 | * | 1.000 | = | 18 | 1152 |
| 6 | 64 | 2164.8 | 1 | 32 | 2000.0 | 23.4 | 27.0 | * | 1.000 | = | 27 | 1728 |
| 6 | 64 | 2164.8 | 1 | 52 | 50.000 | 11.7 | 13.5 | * | 1.000 | = | 13 | 864 |
| 6 | 64 | 2164.8 | 1 | 52 | 100.00 | 11.7 | 13.5 | * | 1.000 | = | 13 | 864 |
| 6 | 64 | 2164.8 | 1 | 52 | 400.00 | 15.6 | 18.0 | * | 1.000 | = | 18 | 1152 |
| 6 | 64 | 2164.8 | 1 | 52 | 1000.0 | 15.6 | 18.0 | * | 1.000 | = | 18 | 1152 |
| 6 | 64 | 2164.8 | 1 | 52 | 2000.0 | 23.4 | 27.0 | * | 1.000 | = | 27 | 1728 |
| 6 | 64 | 2164.8 | 2 | 12 | 50.000 | 16.2 | 18.8 | * | 1.000 | = | 18 | 1200 |
| 6 | 64 | 2164.8 | 2 | 12 | 100.00 | 16.2 | 18.8 | * | 1.000 | = | 18 | 1200 |
| 6 | 64 | 2164.8 | 2 | 12 | 400.00 | 21.6 | 25.0 | * | 1.000 | = | 25 | 1600 |
| 6 | 64 | 2164.8 | 2 | 12 | 1000.0 | 21.6 | 25.0 | * | 1.000 | = | 25 | 1600 |
| 6 | 64 | 2164.8 | 2 | 12 | 2000.0 | 32.5 | 37.5 | * | 1.000 | = | 37 | 2400 |
| 6 | 64 | 2164.8 | 2 | 32 | 50.000 | 24.4 | 28.1 | * | 1.000 | = | 28 | 1800 |
| 6 | 64 | 2164.8 | 2 | 32 | 100.00 | 24.4 | 28.1 | * | 1.000 | = | 28 | 1800 |
| 6 | 64 | 2164.8 | 2 | 32 | 400.00 | 32.5 | 37.5 | * | 1.000 | = | 37 | 2400 |
| 6 | 64 | 2164.8 | 2 | 32 | 1000.0 | 32.5 | 37.5 | * | 1.000 | = | 37 | 2400 |
| 6 | 64 | 2164.8 | 2 | 32 | 2000.0 | 48.7 | 56.3 | * | 1.000 | = | 56 | 3600 |
| 6 | 64 | 2164.8 | 2 | 52 | 50.000 | 64.9 | 75.0 | * | 1.000 | = | 75 | 4800 |
| 6 | 64 | 2164.8 | 2 | 52 | 100.00 | 64.9 | 75.0 | * | 1.000 | = | 75 | 4800 |
| 6 | 64 | 2164.8 | 2 | 52 | 400.00 | 86.6 | 100.0 | * | 1.000 | = | 100 | 6400 |
| 6 | 64 | 2164.8 | 2 | 52 | 1000.0 | 86.6 | 100.0 | * | 1.000 | = | 100 | 6400 |
| 6 | 64 | 2164.8 | 2 | 52 | 2000.0 | 129.9 | 150.0 | * | 1.000 | = | 150 | 9600 |
| 7 | 128 | 4329.6 | 0 | 12 | 50.000 | 5.20 | 3.00 | * | 1.000 | = | 3 | 384 |
| 7 | 128 | 4329.6 | 0 | 12 | 100.00 | 5.20 | 3.00 | * | 1.000 | = | 3 | 384 |
| 7 | 128 | 4329.6 | 0 | 12 | 400.00 | 6.93 | 4.00 | * | 1.000 | = | 4 | 512 |
| 7 | 128 | 4329.6 | 0 | 12 | 1000.0 | 6.93 | 4.00 | * | 1.000 | = | 4 | 512 |
| 7 | 128 | 4329.6 | 0 | 12 | 2000.0 | 10.4 | 6.00 | * | 1.000 | = | 6 | 768 |
| 7 | 128 | 4329.6 | 0 | 32 | 50.000 | 7.79 | 4.50 | * | 1.000 | = | 4 | 576 |
| 7 | 128 | 4329.6 | 0 | 32 | 100.00 | 7.79 | 4.50 | * | 1.000 | = | 4 | 576 |
| 7 | 128 | 4329.6 | 0 | 32 | 400.00 | 10.4 | 6.00 | * | 1.000 | = | 6 | 768 |
| 7 | 128 | 4329.6 | 0 | 32 | 1000.0 | 10.4 | 6.00 | * | 1.000 | = | 6 | 768 |
| 7 | 128 | 4329.6 | 0 | 32 | 2000.0 | 15.6 | 9.00 | * | 1.000 | = | 9 | 1152 |
| 7 | 128 | 4329.6 | 0 | 52 | 50.000 | 10.4 | 6.00 | * | 1.000 | = | 6 | 768 |
| 7 | 128 | 4329.6 | 0 | 52 | 100.00 | 10.4 | 6.00 | * | 1.000 | = | 6 | 768 |
| 7 | 128 | 4329.6 | 0 | 52 | 400.00 | 13.9 | 8.00 | * | 1.000 | = | 8 | 1024 |
| 7 | 128 | 4329.6 | 0 | 52 | 1000.0 | 13.9 | 8.00 | * | 1.000 | = | 8 | 1024 |
| 7 | 128 | 4329.6 | 0 | 52 | 2000.0 | 20.8 | 12.0 | * | 1.000 | = | 12 | 1536 |
| 7 | 128 | 4329.6 | 1 | 12 | 50.000 | 7.79 | 4.50 | * | 1.000 | = | 4 | 576 |
| 7 | 128 | 4329.6 | 1 | 12 | 100.00 | 7.79 | 4.50 | * | 1.000 | = | 4 | 576 |
| 7 | 128 | 4329.6 | 1 | 12 | 400.00 | 10.4 | 6.00 | * | 1.000 | = | 6 | 768 |
| 7 | 128 | 4329.6 | 1 | 12 | 1000.0 | 10.4 | 6.00 | * | 1.000 | = | 6 | 768 |
| 7 | 128 | 4329.6 | 1 | 12 | 2000.0 | 15.6 | 9.00 | * | 1.000 | = | 9 | 1152 |
| 7 | 128 | 4329.6 | 1 | 32 | 50.000 | 11.7 | 6.75 | * | 1.000 | = | 6 | 864 |
| 7 | 128 | 4329.6 | 1 | 32 | 100.00 | 11.7 | 6.75 | * | 1.000 | = | 6 | 864 |
| 7 | 128 | 4329.6 | 1 | 32 | 400.00 | 15.6 | 9.00 | * | 1.000 | = | 9 | 1152 |
| 7 | 128 | 4329.6 | 1 | 32 | 1000.0 | 15.6 | 9.00 | * | 1.000 | = | 9 | 1152 |
| 7 | 128 | 4329.6 | 1 | 32 | 2000.0 | 23.4 | 13.5 | * | 1.000 | = | 13 | 1729 |
| 7 | 128 | 4329.6 | 1 | 52 | 50.000 | 11.7 | 6.75 | * | 1.000 | = | 6 | 864 |
| 7 | 128 | 4329.6 | 1 | 52 | 100.00 | 11.7 | 6.75 | * | 1.000 | = | 6 | 864 |
| 7 | 128 | 4329.6 | 1 | 52 | 400.00 | 15.6 | 9.00 | * | 1.000 | = | 9 | 1152 |
| 7 | 128 | 4329.6 | 1 | 52 | 1000.0 | 15.6 | 9.00 | * | 1.000 | = | 9 | 1152 |
| 7 | 128 | 4329.6 | 1 | 52 | 2000.0 | 23.4 | 13.5 | * | 1.000 | = | 13 | 1728 |
| 7 | 128 | 4329.6 | 2 | 12 | 50.000 | 16.2 | 9.38 | * | 1.000 | = | 9 | 1200 |
| 7 | 128 | 4329.6 | 2 | 12 | 100.00 | 16.2 | 9.38 | * | 1.000 | = | 9 | 1200 |
| 7 | 128 | 4329.6 | 2 | 12 | 400.00 | 21.6 | 12.5 | * | 1.000 | = | 12 | 1600 |
| 7 | 128 | 4329.6 | 2 | 12 | 1000.0 | 21.6 | 12.5 | * | 1.000 | = | 12 | 1600 |
| 7 | 128 | 4329.6 | 2 | 12 | 2000.0 | 32.5 | 18.8 | * | 1.000 | = | 18 | 2400 |
| 7 | 128 | 4329.6 | 2 | 32 | 50.000 | 24.4 | 14.1 | * | 1.000 | = | 14 | 1800 |
| 7 | 128 | 4329.6 | 2 | 32 | 100.00 | 24.4 | 14.1 | * | 1.000 | = | 14 | 1800 |
| 7 | 128 | 4329.6 | 2 | 32 | 400.00 | 32.5 | 18.8 | * | 1.000 | = | 18 | 2400 |

TABLE 3-continued

DATA POINTS PER PULSEWIDTH TABLE

| | | | | | | | | | | | | |
|---|---|---|---|---|---|---|---|---|---|---|---|---|
| 7 | 128 | 4329.6 | 2 | 32 | 1000.0 | 32.5 | 18.8 | * | 1.000 | = | 18 | 2400 |
| 7 | 128 | 4329.6 | 2 | 32 | 2000.0 | 48.7 | 28.1 | * | 1.000 | = | 28 | 3600 |
| 7 | 128 | 4329.6 | 2 | 52 | 50.000 | 64.9 | 37.5 | * | 1.000 | = | 37 | 4800 |
| 7 | 128 | 4329.6 | 2 | 52 | 100.00 | 64.9 | 37.5 | * | 1.000 | = | 37 | 4800 |
| 7 | 128 | 4329.6 | 2 | 52 | 400.00 | 86.6 | 50.0 | * | 1.000 | = | 50 | 6400 |
| 7 | 128 | 4329.6 | 2 | 52 | 1000.0 | 86.6 | 50.0 | * | 1.000 | = | 50 | 6400 |
| 7 | 128 | 4329.6 | 2 | 52 | 2000.0 | 129.9 | 75.0 | * | 1.000 | = | 75 | 9600 |
| 8 | 256 | 8659.2 | 0 | 12 | 50.000 | 5.20 | 1.50 | * | 1.000 | = | 1 | 384 |
| 8 | 256 | 8659.2 | 0 | 12 | 100.00 | 5.20 | 1.50 | * | 1.000 | = | 1 | 384 |
| 8 | 256 | 8659.2 | 0 | 12 | 400.00 | 6.93 | 2.00 | * | 1.000 | = | 2 | 512 |
| 8 | 256 | 8659.2 | 0 | 12 | 1000.0 | 6.93 | 2.00 | * | 1.000 | = | 2 | 512 |
| 8 | 256 | 8659.2 | 0 | 12 | 2000.0 | 10.4 | 3.00 | * | 1.000 | = | 3 | 768 |
| 8 | 256 | 8659.2 | 0 | 32 | 50.000 | 7.79 | 2.25 | * | 1.000 | = | 2 | 576 |
| 8 | 256 | 8659.2 | 0 | 32 | 100.00 | 7.79 | 2.25 | * | 1.000 | = | 2 | 576 |
| 8 | 256 | 8659.2 | 0 | 32 | 400.00 | 10.4 | 3.00 | * | 1.000 | = | 3 | 768 |
| 8 | 256 | 8659.2 | 0 | 32 | 1000.0 | 10.4 | 3.00 | * | 1.000 | = | 3 | 768 |
| 8 | 256 | 8659.2 | 0 | 32 | 2000.0 | 15.6 | 4.50 | * | 1.000 | = | 4 | 1152 |
| 8 | 256 | 8659.2 | 0 | 52 | 50.000 | 10.4 | 3.00 | * | 1.000 | = | 3 | 768 |
| 8 | 256 | 8659.2 | 0 | 52 | 100.00 | 10.4 | 3.00 | * | 1.000 | = | 3 | 768 |
| 8 | 256 | 8659.2 | 0 | 52 | 400.00 | 13.9 | 4.00 | * | 1.000 | = | 4 | 1024 |
| 8 | 256 | 8659.2 | 0 | 52 | 1000.0 | 13.9 | 4.00 | * | 1.000 | = | 4 | 1024 |
| 8 | 256 | 8659.2 | 0 | 52 | 2000.0 | 20.8 | 6.00 | * | 1.000 | = | 6 | 1536 |
| 8 | 256 | 8659.2 | 1 | 12 | 50.000 | 7.79 | 2.25 | * | 1.000 | = | 2 | 576 |
| 8 | 256 | 8659.2 | 1 | 12 | 100.00 | 7.79 | 2.25 | * | 1.000 | = | 2 | 576 |
| 8 | 256 | 8659.2 | 1 | 12 | 400.00 | 10.4 | 3.00 | * | 1.000 | = | 3 | 768 |
| 8 | 256 | 8659.2 | 1 | 12 | 1000.0 | 10.4 | 3.00 | * | 1.000 | = | 3 | 768 |
| 8 | 256 | 8659.2 | 1 | 12 | 2000.0 | 15.6 | 4.50 | * | 1.000 | = | 4 | 1152 |
| 8 | 256 | 8659.2 | 1 | 32 | 50.000 | 11.7 | 3.38 | * | 1.000 | = | 3 | 864 |
| 8 | 256 | 8659.2 | 1 | 32 | 100.00 | 11.7 | 3.38 | * | 1.000 | = | 3 | 864 |
| 8 | 256 | 8659.2 | 1 | 32 | 400.00 | 15.6 | 4.50 | * | 1.000 | = | 4 | 1152 |
| 8 | 256 | 8659.2 | 1 | 32 | 1000.0 | 15.6 | 4.50 | * | 1.000 | = | 4 | 1152 |
| 8 | 255 | 8659.2 | 1 | 32 | 2000.0 | 23.4 | 6.75 | * | 1.000 | = | 6 | 1728 |
| 8 | 256 | 8659.2 | 1 | 52 | 50.000 | 11.7 | 3.38 | * | 1.000 | = | 3 | 864 |
| 8 | 256 | 8659.2 | 1 | 52 | 100.00 | 11.7 | 3.38 | * | 1.000 | = | 3 | 864 |
| 8 | 256 | 8559.2 | 1 | 52 | 400.00 | 15.6 | 4.50 | * | 1.000 | = | 4 | 1152 |
| 8 | 256 | 8659.2 | 1 | 52 | 1000.0 | 15.6 | 4.50 | * | 1.000 | = | 4 | 1152 |
| 8 | 256 | 8659.2 | 1 | 52 | 2000.0 | 23.4 | 6.75 | * | 1.000 | = | 6 | 1728 |
| 8 | 256 | 8659.2 | 2 | 12 | 50.000 | 16.2 | 4.69 | * | 1.000 | = | 4 | 1200 |
| 8 | 256 | 8659.2 | 2 | 12 | 100.00 | 16.2 | 4.69 | * | 1.000 | = | 4 | 1200 |
| 8 | 256 | 8659.2 | 2 | 12 | 400.00 | 21.6 | 6.25 | * | 1.000 | = | 6 | 1600 |
| 8 | 256 | 8659.2 | 2 | 12 | 1000.0 | 21.6 | 6.25 | * | 1.000 | = | 6 | 1600 |
| 8 | 256 | 8659.2 | 2 | 12 | 2000.0 | 32.5 | 9.38 | * | 1.000 | = | 9 | 2400 |
| 8 | 256 | 8659.2 | 2 | 32 | 50.000 | 24.4 | 7.03 | * | 1.000 | = | 7 | 1800 |
| 8 | 256 | 8659.2 | 2 | 32 | 100.00 | 24.4 | 7.03 | * | 1.000 | = | 7 | 1800 |
| 8 | 256 | 8659.2 | 2 | 32 | 400.00 | 32.5 | 9.38 | * | 1.000 | = | 9 | 2400 |
| 8 | 256 | 8659.2 | 2 | 32 | 1000.0 | 32.5 | 9.38 | * | 1.000 | = | 9 | 2400 |
| 8 | 256 | 8659.2 | 2 | 32 | 2000.0 | 48.7 | 14.1 | * | 1.000 | = | 14 | 3600 |
| 8 | 256 | 8659.2 | 2 | 52 | 50.000 | 64.9 | 18.8 | * | 1.000 | = | 18 | 4800 |
| 8 | 256 | 8659.2 | 2 | 52 | 100.00 | 54.9 | 18.8 | * | 1.000 | = | 18 | 4800 |
| 8 | 256 | 8659.2 | 2 | 52 | 400.00 | 86.6 | 25.0 | * | 1.000 | = | 25 | 6400 |
| 8 | 256 | 8659.2 | 2 | 52 | 1000.0 | 86.6 | 25.0 | * | 1.000 | = | 25 | 6400 |
| 8 | 256 | 8659.2 | 2 | 52 | 2000.0 | 129.9 | 37.5 | * | 1.000 | = | 37 | 9600 |
| 9 | 512 | 17318.4 | 0 | 12 | 50.000 | 5.20 | 0.75 | * | 1.000 | = | 1 | 384 |
| 9 | 512 | 17318.4 | 0 | 12 | 100.00 | 5.20 | 0.75 | * | 1.000 | = | 1 | 384 |
| 9 | 512 | 17318.4 | 0 | 12 | 400.00 | 6.93 | 1.00 | * | 1.000 | = | 1 | 512 |
| 9 | 512 | 17318.4 | 0 | 12 | 1000.0 | 6.93 | 1.00 | * | 1.000 | = | 1 | 512 |
| 9 | 512 | 17318.4 | 0 | 12 | 2000.0 | 10.4 | 1.50 | * | 1.000 | = | 1 | 768 |
| 9 | 512 | 17318.4 | 0 | 32 | 50.000 | 7.79 | 1.13 | * | 1.000 | = | 1 | 576 |
| 9 | 512 | 17318.4 | 0 | 32 | 100.00 | 7.79 | 1.13 | * | 1.000 | = | 1 | 576 |
| 9 | 512 | 17318.4 | 0 | 32 | 400.00 | 10.4 | 1.50 | * | 1.000 | = | 1 | 768 |
| 9 | 512 | 17318.4 | 0 | 32 | 1000.0 | 10.4 | 1.50 | * | 1.000 | = | 1 | 768 |
| 9 | 512 | 17318.4 | 0 | 32 | 2000.0 | 15.6 | 2.25 | * | 1.000 | = | 2 | 1152 |
| 9 | 512 | 17318.4 | 0 | 52 | 50.000 | 10.4 | 1.50 | * | 1.000 | = | 1 | 768 |
| 9 | 512 | 17318.4 | 0 | 52 | 100.00 | 10.4 | 1.50 | * | 1.000 | = | 1 | 768 |
| 9 | 512 | 17318.4 | 0 | 52 | 400.00 | 13.9 | 2.00 | * | 1.000 | = | 2 | 1024 |
| 9 | 512 | 17318.4 | 0 | 52 | 1000.0 | 13.9 | 2.00 | * | 1.000 | = | 2 | 1024 |
| 9 | 512 | 17318.4 | 0 | 52 | 2000.0 | 20.8 | 3.00 | * | 1.000 | = | 3 | 1536 |
| 9 | 512 | 17318.4 | 1 | 12 | 50.000 | 7.79 | 1.13 | * | 1.000 | = | 1 | 576 |
| 9 | 512 | 17318.4 | 1 | 12 | 100.00 | 7.79 | 1.13 | * | 1.000 | = | 1 | 576 |
| 9 | 512 | 17318.4 | 1 | 12 | 400.00 | 10.4 | 1.50 | * | 1.000 | = | 1 | 768 |
| 9 | 512 | 17318.4 | 1 | 12 | 1000.0 | 10.4 | 1.50 | * | 1.000 | = | 1 | 768 |
| 9 | 512 | 17318.4 | 1 | 12 | 2000.0 | 15.6 | 2.25 | * | 1.000 | = | 2 | 1152 |
| 9 | 512 | 17318.4 | 1 | 32 | 50.000 | 11.7 | 1.69 | * | 1.000 | = | 1 | 864 |
| 9 | 512 | 17318.4 | 1 | 32 | 100.00 | 11.7 | 1.69 | * | 1.000 | = | 1 | 864 |
| 9 | 512 | 17318.4 | 1 | 32 | 400.00 | 15.6 | 2.25 | * | 1.000 | = | 2 | 1152 |
| 9 | 512 | 17318.4 | 1 | 32 | 1000.0 | 15.6 | 2.25 | * | 1.000 | = | 2 | 1152 |
| 9 | 512 | 17318.4 | 1 | 32 | 2000.0 | 23.4 | 3.38 | * | 1.000 | = | 3 | 1728 |

TABLE 3-continued

DATA POINTS PER PULSEWIDTH TABLE

| | | | | | | | | | | | |
|---|---|---|---|---|---|---|---|---|---|---|---|
| 9 | 512 | 17318.4 | 1 | 52 | 50.000 | 11.7 | 1.69 | * | 1.000 | = | 1 | 864 |
| 9 | 512 | 17318.4 | 1 | 52 | 100.00 | 11.7 | 1.69 | * | 1.000 | = | 1 | 864 |
| 9 | 512 | 17318.4 | 1 | 52 | 400.00 | 15.6 | 2.25 | * | 1.000 | = | 2 | 1152 |
| 9 | 512 | 17318.4 | 1 | 52 | 1000.0 | 15.6 | 2.25 | * | 1.000 | = | 2 | 1152 |
| 9 | 512 | 17318.4 | 1 | 52 | 2000.0 | 23.4 | 3.38 | * | 1.000 | = | 3 | 1728 |
| 9 | 512 | 17318.4 | 2 | 12 | 50.000 | 16.2 | 2.34 | * | 1.000 | = | 2 | 1200 |
| 9 | 512 | 17318.4 | 2 | 12 | 100.00 | 16.2 | 2.34 | * | 1.000 | = | 2 | 1200 |
| 9 | 512 | 17318.4 | 2 | 12 | 400.00 | 21.6 | 3.13 | * | 1.000 | = | 3 | 1600 |
| 9 | 512 | 17318.4 | 2 | 12 | 1000.0 | 21.6 | 3.13 | * | 1.000 | = | 3 | 1600 |
| 9 | 512 | 17318.4 | 2 | 12 | 2000.0 | 32.5 | 4.69 | * | 1.000 | = | 4 | 2400 |
| 9 | 512 | 17318.4 | 2 | 32 | 50.000 | 24.4 | 3.52 | * | 1.000 | = | 3 | 1800 |
| 9 | 512 | 17318.4 | 2 | 32 | 100.00 | 24.4 | 3.52 | * | 1.000 | = | 3 | 1800 |
| 9 | 512 | 17318.4 | 2 | 32 | 400.00 | 32.5 | 4.69 | * | 1.000 | = | 4 | 2400 |
| 9 | 512 | 17318.4 | 2 | 32 | 1000.0 | 32.5 | 4.69 | * | 1.000 | = | 4 | 2400 |
| 9 | 512 | 17318.4 | 2 | 32 | 2000.0 | 48.7 | 7.03 | * | 1.000 | = | 7 | 3600 |
| 9 | 512 | 17318.4 | 2 | 52 | 50.000 | 64.9 | 9.38 | * | 1.000 | = | 9 | 4800 |
| 9 | 512 | 17318.4 | 2 | 52 | 100.00 | 64.9 | 9.38 | * | 1.000 | = | 9 | 4800 |
| 9 | 512 | 17318.4 | 2 | 52 | 400.00 | 86.6 | 12.5 | * | 1.000 | = | 12 | 6400 |
| 9 | 512 | 17318.4 | 2 | 52 | 1000.0 | 86.6 | 12.5 | * | 1.000 | = | 12 | 6400 |
| 9 | 512 | 17318.4 | 2 | 52 | 2000.0 | 129.9 | 18.8 | * | 1.000 | = | 18 | 9600 |
| 10 | 1024 | 34636.8 | 0 | 12 | 50.000 | 5.20 | 0.30 | * | 1.250 | = | 1 | 384 |
| 10 | 1024 | 34636.8 | 0 | 12 | 100.00 | 5.20 | 0.30 | * | 1.250 | = | 1 | 384 |
| 10 | 1024 | 34636.8 | 0 | 12 | 400.00 | 6.93 | 0.40 | * | 1.250 | = | 1 | 512 |
| 10 | 1024 | 34636.8 | 0 | 12 | 1000.0 | 6.93 | 0.40 | * | 1.250 | = | 1 | 512 |
| 10 | 1024 | 34636.8 | 0 | 12 | 2000.0 | 10.4 | 0.60 | * | 1.250 | = | 1 | 768 |
| 10 | 1024 | 34636.8 | 0 | 32 | 50.000 | 7.79 | 0.45 | * | 1.250 | = | 1 | 576 |
| 10 | 1024 | 34636.8 | 0 | 32 | 100.00 | 7.79 | 0.45 | * | 1.250 | = | 1 | 576 |
| 10 | 1024 | 34636.8 | 0 | 32 | 400.00 | 10.4 | 0.60 | * | 1.250 | = | 1 | 768 |
| 10 | 1024 | 34636.8 | 0 | 32 | 1000.0 | 10.4 | 0.60 | * | 1.250 | = | 1 | 768 |
| 10 | 1024 | 34636.8 | 0 | 32 | 2000.0 | 15.6 | 0.90 | * | 1.250 | = | 1 | 1152 |
| 10 | 1024 | 34636.8 | 0 | 52 | 50.000 | 10.4 | 0.60 | * | 1.250 | = | 1 | 768 |
| 10 | 1024 | 34636.8 | 0 | 52 | 100.00 | 10.4 | 0.60 | * | 1.250 | = | 1 | 768 |
| 10 | 1024 | 34636.8 | 0 | 52 | 400.00 | 13.9 | 0.80 | * | 1.250 | = | 1 | 1024 |
| 10 | 1024 | 34636.8 | 0 | 52 | 1000.0 | 13.9 | 0.80 | * | 1.250 | = | 1 | 1024 |
| 10 | 1024 | 34636.8 | 0 | 52 | 2000.0 | 20.8 | 1.20 | * | 1.250 | = | 1 | 1536 |
| 10 | 1024 | 34636.8 | 1 | 12 | 50.000 | 7.79 | 0.45 | * | 1.250 | = | 1 | 576 |
| 10 | 1024 | 34636.8 | 1 | 12 | 100.00 | 7.79 | 0.45 | * | 1.250 | = | 1 | 576 |
| 10 | 1024 | 34636.8 | 1 | 12 | 400.00 | 10.4 | 0.60 | * | 1.250 | = | 1 | 768 |
| 10 | 1024 | 34636.8 | 1 | 12 | 1000.0 | 10.4 | 0.60 | * | 1.250 | = | 1 | 768 |
| 10 | 1024 | 34636.8 | 1 | 12 | 2000.0 | 15.6 | 0.90 | * | 1.250 | = | 1 | 1152 |
| 10 | 1024 | 34636.8 | 1 | 32 | 50.000 | 11.7 | 0.68 | * | 1.250 | = | 1 | 864 |
| 10 | 1024 | 34636.8 | 1 | 32 | 100.00 | 11.7 | 0.68 | * | 1.250 | = | 1 | 864 |
| 10 | 1024 | 34636.8 | 1 | 32 | 400.00 | 15.6 | 0.90 | * | 1.250 | = | 1 | 1152 |
| 10 | 1024 | 34636.8 | 1 | 32 | 1000.0 | 15.6 | 0.90 | * | 1.250 | = | 1 | 1152 |
| 10 | 1024 | 34636.8 | 1 | 32 | 2000.0 | 23.4 | 1.35 | * | 1.250 | = | 1 | 1728 |
| 10 | 1024 | 34636.8 | 1 | 52 | 50.000 | 11.7 | 0.68 | * | 1.250 | = | 1 | 864 |
| 10 | 1024 | 34636.8 | 1 | 52 | 100.00 | 11.7 | 0.68 | * | 1.250 | = | 1 | 864 |
| 10 | 1024 | 34636.8 | 1 | 52 | 400.00 | 15.6 | 0.90 | * | 1.250 | = | 1 | 1152 |
| 10 | 1024 | 34636.8 | 1 | 52 | 1000.0 | 15.6 | 0.90 | * | 1.250 | = | 1 | 1152 |
| 10 | 1024 | 34636.8 | 1 | 52 | 2000.0 | 23.4 | 1.35 | * | 1.250 | = | 1 | 1728 |
| 10 | 1024 | 34636.8 | 2 | 12 | 50.000 | 16.2 | 0.94 | * | 1.250 | = | 1 | 1200 |
| 10 | 1024 | 34636.8 | 2 | 12 | 100.00 | 16.2 | 0.94 | * | 1.250 | = | 1 | 1200 |
| 10 | 1024 | 34636.8 | 2 | 12 | 400.00 | 21.6 | 1.25 | * | 1.250 | = | 1 | 1600 |
| 10 | 1024 | 34636.8 | 2 | 12 | 1000.0 | 21.6 | 1.25 | * | 1.250 | = | 1 | 1600 |
| 10 | 1024 | 34636.8 | 2 | 12 | 2000.0 | 32.5 | 1.88 | * | 1.250 | = | 1 | 2400 |
| 10 | 1024 | 34636.8 | 2 | 32 | 50.000 | 24.4 | 1.41 | * | 1.250 | = | 1 | 1800 |
| 10 | 1024 | 34636.8 | 2 | 32 | 100.00 | 24.4 | 1.41 | * | 1.250 | = | 1 | 1800 |
| 10 | 1024 | 34636.8 | 2 | 32 | 400.00 | 32.5 | 1.88 | * | 1.250 | = | 1 | 2400 |
| 10 | 1024 | 34636.8 | 2 | 32 | 1000.0 | 32.5 | 1.88 | * | 1.250 | = | 1 | 2400 |
| 10 | 1024 | 34636.8 | 2 | 32 | 2000.0 | 48.7 | 2.81 | * | 1.250 | = | 2 | 3600 |
| 10 | 1024 | 34636.8 | 2 | 52 | 50.000 | 64.9 | 3.75 | * | 1.250 | = | 3 | 4800 |
| 10 | 1024 | 34636.8 | 2 | 52 | 100.00 | 64.9 | 3.75 | * | 1.250 | = | 3 | 4800 |
| 10 | 1024 | 34636.8 | 2 | 52 | 400.00 | 86.6 | 5.00 | * | 1.250 | = | 6 | 6400 |
| 10 | 1024 | 34636.8 | 2 | 52 | 1000.0 | 86.6 | 5.00 | * | 1.250 | = | 6 | 6400 |
| 10 | 1024 | 34636.8 | 2 | 52 | 2000.0 | 129.9 | 7.50 | * | 1.250 | = | 8 | 9600 |
| 11 | 2048 | 69273.6 | 0 | 12 | 50.000 | 5.20 | 0.15 | * | 1.250 | = | 1 | 354 |
| 11 | 2048 | 69273.6 | 0 | 12 | 100.00 | 5.20 | 0.15 | * | 1.250 | = | 1 | 384 |
| 11 | 2048 | 69273.6 | 0 | 12 | 400.00 | 6.93 | 0.20 | * | 1.250 | = | 1 | 512 |
| 11 | 2048 | 69273.6 | 0 | 12 | 1000.0 | 6.93 | 0.20 | * | 1.250 | = | 1 | 512 |
| 11 | 2048 | 69273.6 | 0 | 12 | 2000.0 | 10.4 | 0.30 | * | 1.250 | = | 1 | 768 |
| 11 | 2048 | 69273.6 | 0 | 32 | 50.000 | 7.79 | 0.22 | * | 1.250 | = | 1 | 576 |
| 11 | 2048 | 69273.6 | 0 | 32 | 100.00 | 7.79 | 0.22 | * | 1.250 | = | 1 | 576 |
| 11 | 2048 | 69273.6 | 0 | 32 | 400.00 | 10.4 | 0.30 | * | 1.250 | = | 1 | 768 |
| 11 | 2048 | 69273.6 | 0 | 32 | 1000.0 | 10.4 | 0.30 | * | 1.250 | = | 1 | 768 |
| 11 | 2048 | 69273.6 | 0 | 32 | 2000.0 | 15.6 | 0.45 | * | 1.250 | = | 1 | 1152 |
| 11 | 2048 | 69273.6 | 0 | 52 | 50.000 | 10.4 | 0.30 | * | 1.250 | = | 1 | 768 |
| 11 | 2048 | 69273.6 | 0 | 52 | 100.00 | 10.4 | 0.30 | * | 1.250 | = | 1 | 768 |

TABLE 3-continued

DATA POINTS PER PULSEWIDTH TABLE

| | | | | | | | | | | | | |
|---|---|---|---|---|---|---|---|---|---|---|---|---|
| 11 | 2048 | 69273.6 | 0 | 52 | 400.00 | 13.9 | 0.40 | * | 1.250 | = | 1 | 1024 |
| 11 | 2048 | 69273.6 | 0 | 52 | 1000.0 | 13.9 | 0.40 | * | 1.250 | = | 1 | 1024 |
| 11 | 2048 | 69273.6 | 0 | 52 | 2000.0 | 20.8 | 0.60 | * | 1.250 | = | 1 | 1536 |
| 11 | 2048 | 69273.6 | 1 | 12 | 50.000 | 7.79 | 0.22 | * | 1.250 | = | 1 | 576 |
| 11 | 2048 | 69273.6 | 1 | 12 | 100.00 | 7.79 | 0.22 | * | 1.250 | = | 1 | 576 |
| 11 | 2048 | 69273.6 | 1 | 12 | 400.00 | 10.4 | 0.30 | * | 1.250 | = | 1 | 768 |
| 11 | 2048 | 69273.6 | 1 | 12 | 1000.0 | 10.4 | 0.30 | * | 1.250 | = | 1 | 768 |
| 11 | 2048 | 69273.6 | 1 | 12 | 2000.0 | 15.6 | 0.45 | * | 1.250 | = | 1 | 1152 |
| 11 | 2048 | 69271.6 | 1 | 32 | 50.000 | 11.7 | 0.34 | * | 1.250 | = | 1 | 864 |
| 11 | 2048 | 69273.6 | 1 | 32 | 100.00 | 11.7 | 0.34 | * | 1.250 | = | 1 | 864 |
| 11 | 2048 | 69273.6 | 1 | 32 | 400.00 | 15.6 | 0.45 | * | 1.250 | = | 1 | 1152 |
| 11 | 2048 | 69273.6 | 1 | 32 | 1000.0 | 15.6 | 0.45 | * | 1.250 | = | 1 | 1152 |
| 11 | 2048 | 69273.6 | 1 | 32 | 2000.0 | 23.4 | 0.68 | * | 1.250 | = | 1 | 1728 |
| 11 | 2048 | 69273.6 | 1 | 52 | 50.000 | 11.7 | 0.34 | * | 1.250 | = | 1 | 864 |
| 11 | 2048 | 69273.6 | 1 | 52 | 100.00 | 11.7 | 0.34 | * | 1.250 | = | 1 | 864 |
| 11 | 2048 | 69273.6 | 1 | 52 | 400.00 | 15.6 | 0.45 | * | 1.250 | = | 1 | 1152 |
| 11 | 2048 | 69273.6 | 1 | 52 | 1000.0 | 15.6 | 0.45 | * | 1.250 | = | 1 | 1152 |
| 11 | 2048 | 69273.6 | 1 | 52 | 2000.0 | 23.4 | 0.68 | * | 1.250 | = | 1 | 1728 |
| 11 | 2048 | 69273.6 | 2 | 12 | 50.000 | 16.2 | 0.47 | * | 1.250 | = | 1 | 1200 |
| 11 | 2048 | 69273.6 | 2 | 12 | 100.00 | 16.2 | 0.47 | * | 1.250 | = | 1 | 1200 |
| 11 | 2048 | 69273.6 | 2 | 12 | 400.00 | 21.6 | 0.63 | * | 1.250 | = | 1 | 1600 |
| 11 | 2048 | 69273.6 | 2 | 12 | 1000.0 | 21.6 | 0.63 | * | 1.250 | = | 1 | 1600 |
| 11 | 2048 | 69273.6 | 2 | 12 | 2000.0 | 32.5 | 0.94 | * | 1.250 | = | 1 | 2400 |
| 11 | 2048 | 69273.6 | 2 | 32 | 50.000 | 24.4 | 0.70 | * | 1.250 | = | 1 | 1800 |
| 11 | 2048 | 69273.6 | 2 | 32 | 100.00 | 24.4 | 0.70 | * | 1.250 | = | 1 | 1800 |
| 11 | 2048 | 69273.6 | 2 | 32 | 400.00 | 32.5 | 0.94 | * | 1.250 | = | 1 | 2400 |
| 11 | 2048 | 69273.6 | 2 | 32 | 1000.0 | 32.5 | 0.94 | * | 1.250 | = | 1 | 2400 |
| 11 | 2048 | 69273.6 | 2 | 32 | 2000.0 | 48.7 | 1.41 | * | 1.250 | = | 1 | 3600 |
| 11 | 2048 | 69273.6 | 2 | 52 | 50.000 | 64.9 | 1.88 | * | 1.250 | = | 1 | 4800 |
| 11 | 2048 | 69273.6 | 2 | 52 | 100.00 | 64.9 | 1.88 | * | 1.250 | = | 1 | 4800 |
| 11 | 2048 | 69273.6 | 2 | 52 | 400.00 | 86.6 | 2.50 | * | 1.250 | = | 2 | 6400 |
| 11 | 2048 | 69273.6 | 2 | 52 | 1000.0 | 86.6 | 2.50 | * | 1.250 | = | 2 | 6400 |
| 11 | 2048 | 69273.6 | 2 | 52 | 2000.0 | 129.9 | 3.75 | * | 1.250 | = | 3 | 9600 |

Key
DI = Index into Legaispanvalues (Delta) array
DT = global acqrange value (called Delta in modfic)
2500 Sp = Span in feet of 2500 data point acquisition
PWN = global PW value (i.e. - 0, 1, 2)
Ew (ft) = Typical event width in feet
DIST (ft) = Range of event in feet.
ActPts = Number of actual (or real) acquisition data points per typical event
ExF = Number of extrapolation data points for each real data point
ExtPts = Number of data points per typical event after extrapolation

What is claimed is:

1. An apparatus for acquiring waveform data from a metallic transmission cable under test comprising:

a transmitter coupled to the transmission cable under test via an electrical interface for generating interrogating pulses for examining a segment length of the transmission cable under test;

a variable gain receiver coupled to the electrical interface for receiving a signal from the segment length of the cable under test for generating at least two gain segment acquisitions of waveform data representative of the signal from the segment length with each gain segment acquisition of waveform data being generated with a different receiver gain; and a controller coupled to the transmitter and the receiver for initiating the generation of interrogating pulses, establishing the receiver gain for each gain segment acquisition of waveform data, and controlling the gain segment acquisitions of waveform data over the segment length.

2. The apparatus for acquiring waveform data as recited in claim 1 wherein the transmitter further comprises a variable pulsewidth generator responsive to an input from the controller for generating an interrogating pulse having a pulsewidth optimized for the segment length of the transmission cable under test.

3. The apparatus for acquiring waveform data as recited in claim 1 wherein the transmitter further comprises a variable pulsewidth generator responsive to inputs from the controller for generating interrogating pulses having a first pulsewidth optimized for characterizing an event for resistance in the segment length of the transmission cable under test and an additional pulsewidth optimized for characterizing the event for inductance and capacitance in the segment length.

4. The apparatus for acquiring waveform data as recited in claim 1 wherein the variable gain receiver further comprises a variable gain amplifier responsive to input from the controller for varying the gain of the amplifier.

5. The apparatus for acquiring waveform data as recited in claim 4 wherein the variable gain receiver further comprises an analog memory coupled to receive an output from the variable gain amplifier for storing analog values of the signal from the cable under test.

6. The apparatus for acquiring waveform data as recited in claim 5 wherein the variable gain receiver further comprises an analog-to-digital converter coupled to the analog memory for generating digital data values of the analog values.

7. The apparatus for acquiring waveform data as recited in claim 1 further comprising an event table containing characterization data on detected events within each gain segment acquisition of waveform data.

8. The apparatus for acquiring waveform data as recited in claim 7 wherein the characterization data includes an index into the table, amplitude, start and end location values derived from the acquired gain segment waveform data, the receiver gain for acquired gain segment waveform data, the pulsewidth of the interrogating pulses for the segment length, a return loss value for the event and a echo flag value.

9. The apparatus for acquiring waveform data as recited in claim 7 further comprising a congruent event filter for determining congruent events in the respective gain segments in the event table and selecting the events having optimum characterization data.

10. The apparatus for acquiring waveform data as recited in claim 9 further comprising an mosaic event table containing the selected events from the event table for each of the plurality of segment lengths having the optimum characterization data.

11. The apparatus for acquiring waveform data as recited in claim 10 further comprising a display device for generating a displayed representation of the acquired waveform data over the segment length having the selected event table events being represented as part of the displayed data.

12. An apparatus for acquiring waveform data from a metallic transmission cable under test comprising:
a transmitter coupled to the transmission cable under test via an electrical interface for generating interrogating pulses for examining a plurality of segment lengths of the transmission cable under test wherein the interrogating pulses have a pulsewidth optimized for each segment length;
a variable gain receiver coupled to the electrical interface for receiving a signal from the plurality of segment lengths for generating at least two gain segment acquisitions of waveform data representative of the signal for each of the plurality of segments lengths with each gain segment acquisition of waveform data for a segment length being generated with a different receiver gain; and
a controller coupled to the transmitter and the receiver for initiating the generation of interrogating pulses, establishing the receiver gain for each gain segment acquisition of waveform data, and controlling the gain segment acquisitions of waveform data over the plurality of segment lengths.

13. The apparatus for acquiring waveform data as recited in claim 12 wherein the transmitter further comprises a variable pulsewidth generator responsive to input from the controller for initiating the generation of the interrogating pulses.

14. The apparatus for acquiring waveform data as recited in claim 12 wherein the transmitter further comprises a variable pulsewidth generator responsive to inputs from the controller for generating interrogating pulses wherein the interrogating pulses for each of the plurality of segment lengths have a first pulsewidth optimized for characterizing an event for resistance and an additional pulsewidth optimized for characterizing an event for inductance and capacitance for each of the plurality of segment lengths.

15. The apparatus for acquiring waveform data as recited in claim 12 wherein the variable gain receiver further comprises a variable gain amplifier responsive to input from the controller for varying the gain of the amplifier.

16. The apparatus for acquiring waveform data as recited in claim 15 wherein the variable gain receiver further comprises an analog memory coupled to receive an output from the variable gain amplifier for storing analog values of the signal from the cable under test.

17. The apparatus for acquiring waveform data as recited in claim 16 wherein the variable gain receiver further comprises an analog-to-digital converter coupled to the analog memory for generating digital data values of the analog values.

18. The apparatus for acquiring waveform data as recited in claim 12 further comprising an event table containing characterization data on detected events within each gain segment acquisition of waveform data from each of the plurality of segments lengths.

19. The apparatus for acquiring waveform data as recited in claim 18 wherein the characterization data includes an index into the table, amplitude, start and end location values derived from the acquired gain segment waveform data, the receiver gain for acquired gain segment waveform data, the pulsewidth of the interrogating pulse for the segment length, a return loss value for the event and a echo flag value.

20. The apparatus for acquiring waveform data as recited in claim 18 further comprising a congruent event filter for determining congruent events in the respective gain segments in each of the respective plurality of segment lengths in the event table and selecting the events in each of the plurality of segment lengths having optimum characterization data.

21. The apparatus for acquiring waveform data as recited in claim 20 further comprising an overlapped event table containing the selected events from the event table for each of the plurality of segment lengths having the optimum characterization data.

22. The apparatus for acquiring waveform data as recited in claim 21 further comprising a mosaic event table containing selected events from the overlapped event table for each of the plurality of segment lengths having the optimum characterization data wherein the congruent event filter determines congruent events in the respective segment lengths in the overlapped event table and selects the events having the optimum characterization data.

23. The apparatus for acquiring waveform data as recited in claim 22 further comprising a display device for generating a displayed representation of the plurality of segment lengths having the selected mosaic event table events being represented as part of the displayed data and wherein an additional acquisition of waveform data is made having an optimal sample spacing for the plurality of segment lengths and the receiver gain being set for acquiring the waveform data with event amplitudes being non-saturated and with the waveform data being scaled for the displayed representation.

* * * * *